(12) United States Patent
Yamazaki et al.

(10) Patent No.: US 6,977,392 B2
(45) Date of Patent: Dec. 20, 2005

(54) SEMICONDUCTOR DISPLAY DEVICE

(75) Inventors: Shunpei Yamazaki, Setagaya-ku (JP); Akira Mase, Okazaki (JP); Masaaki Hiroki, Isehara (JP); Yasuhiko Takemura, Atsugi (JP); Hongyong Zhang, Yamato (JP); Hideki Uochi, Atsugi (JP); Hideki Nemoto, Atsugi (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 150 days.

(21) Appl. No.: 10/390,014

(22) Filed: Mar. 18, 2003

(65) Prior Publication Data

US 2003/0173570 A1 Sep. 18, 2003

Related U.S. Application Data

(60) Division of application No. 09/344,373, filed on Jun. 25, 1999, now Pat. No. 6,566,711, which is a division of application No. 08/479,393, filed on Jun. 7, 1995, now Pat. No. 6,013,928, which is a continuation of application No. 08/190,228, filed on Feb. 1, 1994, now abandoned, which is a continuation of application No. 07/922,759, filed on Jul. 31, 1992, now abandoned.

(30) Foreign Application Priority Data

| Aug. 23, 1991 | (JP) | 3-237100 |
| Nov. 29, 1991 | (JP) | 3-340336 |
| Jan. 24, 1992 | (JP) | 4-34194 |
| Jan. 29, 1992 | (JP) | 4-38637 |
| Feb. 5, 1992 | (JP) | 4-54322 |

(51) Int. Cl.[7] ......................... H01L 31/0392
(52) U.S. Cl. ............... 257/59; 257/72; 257/344; 257/408
(58) Field of Search .................. 257/49, 59–72, 257/344–354, 408

(56) References Cited

U.S. PATENT DOCUMENTS

| 3,798,752 A | 3/1974 | Fujimoto |
| 3,838,209 A | 9/1974 | Tsuchiya et al. |
| 3,955,187 A | 5/1976 | Bigelow |
| 4,021,607 A | 5/1977 | Amano |
| 4,068,020 A | 1/1978 | Reuschel |
| 4,103,297 A | 7/1978 | McGrievy et al. |

(Continued)

FOREIGN PATENT DOCUMENTS

EP    0 161 555    11/1985

(Continued)

OTHER PUBLICATIONS

Wilmsen, "Chemical Composition and Formation of Thermal and Anodic Oxide/III-V compound Semiconductor Interfaces," J. Vac. Sci. Technol., vol. 19, No. 3, Sep./Oct. 1981, pp. 279–287.

(Continued)

Primary Examiner—Allan R. Wilson
(74) Attorney, Agent, or Firm—Eric J. Robinson; Robinson Intellectual Property Law Office, P.C.

(57) ABSTRACT

An insulated-gate field-effect transistor adapted to be used in an active-matrix liquid-crystal display. The channel length, or the distance between the source region and the drain region, is made larger than the length of the gate electrode taken in the longitudinal direction of the channel. Offset regions are formed in the channel region on the sides of the source and drain regions. No or very weak electric field is applied to these offset regions from the gate electrode.

30 Claims, 22 Drawing Sheets

U.S. PATENT DOCUMENTS

| | | |
|---|---|---|
| 4,239,346 A | 12/1980 | Lloyd |
| 4,365,013 A | 12/1982 | Ishioka et al. |
| 4,378,417 A | 3/1983 | Maruyama et al. |
| 4,420,870 A | 12/1983 | Kimura |
| 4,427,978 A | 1/1984 | Williams |
| 4,466,172 A | 8/1984 | Batra |
| 4,468,855 A | 9/1984 | Sasaki |
| 4,528,480 A | 7/1985 | Unagami et al. |
| 4,591,892 A | 5/1986 | Yamazaki |
| 4,597,160 A | 7/1986 | Ipri |
| 4,597,637 A | 7/1986 | Ohta |
| 4,600,274 A | 7/1986 | Morozumi |
| 4,646,426 A | 3/1987 | Sasaki |
| 4,648,691 A | 3/1987 | Oguchi et al. |
| 4,649,432 A | 3/1987 | Watanabe et al. |
| 4,650,543 A | 3/1987 | Kishita et al. |
| 4,653,862 A | 3/1987 | Morozumi |
| 4,660,030 A | 4/1987 | Maezawa |
| 4,670,765 A | 6/1987 | Nakamura et al. |
| 4,680,580 A | 7/1987 | Kawahara |
| 4,716,403 A | 12/1987 | Morozumi |
| 4,727,044 A | 2/1988 | Yamazaki |
| 4,740,829 A | 4/1988 | Nakagiri et al. |
| 4,742,346 A | 5/1988 | Gillette et al. |
| 4,743,096 A | 5/1988 | Wakai et al. |
| 4,752,774 A | 6/1988 | Clerc et al. |
| 4,755,865 A | 7/1988 | Wilson et al. |
| 4,770,502 A | 9/1988 | Kitazima et al. |
| 4,818,077 A | 4/1989 | Ohwada et al. |
| 4,818,981 A | 4/1989 | Oki et al. |
| 4,838,654 A | 6/1989 | Hamaguchi et al. |
| 4,841,294 A | 6/1989 | Clerc |
| 4,860,069 A | 8/1989 | Yamazaki |
| 4,862,237 A | 8/1989 | Morozumi |
| 4,873,516 A | 10/1989 | Castleberry |
| 4,888,305 A | 12/1989 | Yamazaki et al. |
| 4,891,330 A | 1/1990 | Guha et al. |
| 4,897,360 A | 1/1990 | Guckel et al. |
| 4,897,639 A | 1/1990 | Kanayama |
| 4,905,066 A | 2/1990 | Dohjo et al. |
| 4,916,090 A | 4/1990 | Motai et al. |
| 4,938,565 A | 7/1990 | Ichikawa |
| 4,943,837 A | 7/1990 | Konishi et al. |
| 4,949,141 A | 8/1990 | Busta |
| 4,959,700 A | 9/1990 | Yamazaki |
| 4,960,719 A | 10/1990 | Tanaka et al. |
| 4,969,025 A | 11/1990 | Yamamoto et al. |
| 4,969,031 A | 11/1990 | Kobayashi et al. |
| 4,973,135 A | 11/1990 | Okada et al. |
| 4,986,213 A | 1/1991 | Yamazaki et al. |
| 4,988,643 A | 1/1991 | Tsou |
| 5,003,356 A | 3/1991 | Wakai et al. |
| 5,012,228 A | 4/1991 | Masuda et al. |
| 5,016,610 A | 5/1991 | Meguro et al. |
| 5,023,679 A | 6/1991 | Shibata |
| 5,051,570 A | 9/1991 | Tsujikawa et al. |
| 5,055,899 A | 10/1991 | Wakai et al. |
| 5,056,895 A | 10/1991 | Kahn |
| 5,077,223 A | 12/1991 | Yamazaki |
| 5,084,905 A | 1/1992 | Sasaki et al. |
| 5,091,722 A | 2/1992 | Kitajima et al. |
| 5,093,703 A | 3/1992 | Minami et al. |
| RE33,882 E | 4/1992 | Morozumi |
| 5,102,361 A | 4/1992 | Katayama et al. |
| 5,132,754 A | 7/1992 | Serikawa et al. |
| 5,132,821 A | 7/1992 | Nicholas |
| 5,142,272 A | 8/1992 | Kondo |
| 5,142,344 A | 8/1992 | Yamazaki |
| 5,162,901 A | 11/1992 | Shimada et al. |
| 5,182,620 A | 1/1993 | Shimada et al. |
| 5,189,500 A | 2/1993 | Kusunoki |
| 5,194,136 A | 3/1993 | Jeung et al. |
| 5,196,839 A | 3/1993 | Johary et al. |
| 5,200,846 A | 4/1993 | Hiroki et al. |
| 5,206,635 A | 4/1993 | Inuzuka et al. |
| 5,235,195 A | 8/1993 | Tran et al. |
| 5,245,452 A | 9/1993 | Nakamura et al. |
| 5,250,818 A | 10/1993 | Saraswat et al. |
| 5,250,931 A | 10/1993 | Misawa et al. |
| 5,273,910 A | 12/1993 | Tran et al. |
| 5,287,205 A | 2/1994 | Yamazaki |
| 5,289,030 A * | 2/1994 | Yamazaki et al. ........ 257/410 |
| 5,302,845 A | 4/1994 | Kumagai et al. |
| 5,308,998 A | 5/1994 | Yamazaki et al. |
| 5,313,077 A | 5/1994 | Yamazaki |
| 5,315,132 A | 5/1994 | Yamazaki |
| 5,324,678 A | 6/1994 | Kusunoki |
| 5,324,980 A | 6/1994 | Kusunoki |
| 5,327,001 A | 7/1994 | Wakai et al. |
| 5,327,901 A | 7/1994 | Delente |
| 5,329,390 A | 7/1994 | Fujiwara et al. |
| 5,341,012 A | 8/1994 | Misawa et al. |
| 5,358,810 A | 10/1994 | Yoshino |
| 5,408,246 A | 4/1995 | Inaba et al. |
| 5,410,172 A | 4/1995 | Koizumi et al. |
| 5,414,443 A | 5/1995 | Kanatani et al. |
| 5,495,353 A | 2/1996 | Yamazaki et al. |
| 5,521,107 A | 5/1996 | Yamazaki et al. |
| 5,543,636 A | 8/1996 | Yamazaki |
| 5,568,288 A | 10/1996 | Yamazaki |
| 5,612,799 A | 3/1997 | Yamazaki et al. |
| 5,744,818 A | 4/1998 | Yamazaki |
| 5,854,879 A | 12/1998 | Inuzuka et al. |
| 5,933,205 A | 8/1999 | Yamazaki et al. |
| 5,956,105 A | 9/1999 | Yamazaki et al. |
| 5,962,870 A * | 10/1999 | Yamazaki et al. ........... 257/66 |
| 5,963,278 A | 10/1999 | Yamazaki et al. |
| 6,013,928 A | 1/2000 | Yamazaki et al. |
| 6,281,520 B1 | 8/2001 | Yamazaki |
| 6,331,723 B1 | 12/2001 | Yamazaki et al. |
| 6,436,815 B1 | 8/2002 | Yamazaki et al. |
| 6,437,367 B1 | 8/2002 | Yamazaki et al. |

FOREIGN PATENT DOCUMENTS

| | | |
|---|---|---|
| EP | 0 321 073 | 6/1989 |
| EP | 0 349 415 | 1/1990 |
| EP | 0 399 846 | 11/1990 |
| EP | 0 412 701 B1 | 2/1991 |
| EP | 0 321 073 | 1/1994 |
| GB | 1 396 486 | 6/1975 |
| GB | 2 130 781 | 6/1984 |
| GB | 2 187 859 | 9/1987 |
| JP | 49-052598 | 5/1974 |
| JP | 49-77537 | 7/1974 |
| JP | 52-076897 | 6/1977 |
| JP | 53-027483 | 3/1978 |
| JP | 53-144297 | 12/1978 |
| JP | 55-32026 | 3/1980 |
| JP | 55-154750 | 12/1980 |
| JP | 56-094386 | 7/1981 |
| JP | 58-2073 | 1/1983 |
| JP | 58-23478 | 2/1983 |
| JP | 58-23479 | 2/1983 |
| JP | 58-27365 | 2/1983 |
| JP | 58-88781 | 5/1983 |
| JP | 58-105574 | 6/1983 |
| JP | 58-106861 | 6/1983 |
| JP | 58-115864 | 7/1983 |
| JP | 58-118154 | 7/1983 |
| JP | 58-142566 | 8/1983 |
| JP | 58-164268 | 9/1983 |
| JP | 58-186967 | 11/1983 |
| JP | 58-192379 | 11/1983 |

| | | | | | | | |
|---|---|---|---|---|---|---|---|
| JP | 59-21067 | 2/1984 | | JP | 02-282728 | 11/1990 | |
| JP | 59-061818 | 4/1984 | | JP | 02-307273 | 12/1990 | |
| JP | 60-047574 | 3/1985 | | JP | 02-309317 | 12/1990 | |
| JP | 60-48574 | 3/1985 | | JP | 02-310536 | 12/1990 | |
| JP | 60074663 A * | 4/1985 | ........... H01L 27/08 | JP | 03-007911 | 1/1991 | |
| JP | 60-154996 | 10/1985 | | JP | 03-017629 | 1/1991 | |
| JP | 60-245173 | 12/1985 | | JP | 03-024735 | 2/1991 | |
| JP | 60-245174 | 12/1985 | | JP | 03-034434 | 2/1991 | |
| JP | 61-136263 | 6/1986 | | JP | 03-059543 | 3/1991 | |
| JP | 61-141174 | 6/1986 | | JP | 03-108776 | 5/1991 | |
| JP | 62-73658 | 4/1987 | | JP | 03-109739 | 5/1991 | |
| JP | 62-73660 | 4/1987 | | JP | 03-165575 | 7/1991 | |
| JP | 62-105474 | 5/1987 | | JP | 3-165575 | 7/1991 | |
| JP | 62-126677 | 6/1987 | | JP | 3-180058 | 8/1991 | |
| JP | 62-131575 | 6/1987 | | JP | 03-185839 | 8/1991 | |
| JP | 62-193277 | 8/1987 | | JP | 03-217059 | 9/1991 | |
| JP | 62-214669 | 9/1987 | | JP | 3-272183 | 12/1991 | |
| JP | 62-219574 | 9/1987 | | JP | 03-288824 | 12/1991 | |
| JP | 62-283664 | 12/1987 | | JP | 4-15956 | 1/1992 | |
| JP | 63-9978 | 1/1988 | | JP | 04-283729 | 10/1992 | |
| JP | 63-66969 | 3/1988 | | JP | 04-291240 | 10/1992 | |
| JP | 63-70832 | 3/1988 | | JP | 04-299864 | 10/1992 | |
| JP | 63-082177 | 4/1988 | | JP | 04-360580 | 12/1992 | |
| JP | 63-96636 | 4/1988 | | JP | 05-267667 | 10/1993 | |
| JP | 63-100777 | 5/1988 | | | | | |
| JP | 63-101829 | 5/1988 | | | | | |
| JP | 63-119578 | 5/1988 | | | | | |
| JP | 63-126277 | 5/1988 | | | | | |
| JP | 63-178560 | 7/1988 | | | | | |
| JP | 63-219152 | 9/1988 | | | | | |
| JP | 63-237571 | 10/1988 | | | | | |
| JP | 63-279228 | 11/1988 | | | | | |
| JP | 63-283068 | 11/1988 | | | | | |
| JP | 64-012576 | 1/1989 | | | | | |
| JP | 64-023564 | 1/1989 | | | | | |
| JP | 1-30272 | 2/1989 | | | | | |
| JP | 64-30272 | 2/1989 | | | | | |
| JP | 64-068724 | 3/1989 | | | | | |
| JP | 64-68724 | 3/1989 | | | | | |
| JP | 64-68728 | 3/1989 | | | | | |
| JP | 64-068732 | 3/1989 | | | | | |
| JP | 64-076035 | 3/1989 | | | | | |
| JP | 01-107237 | 4/1989 | | | | | |
| JP | 64-89464 | 4/1989 | | | | | |
| JP | 01-124824 | 5/1989 | | | | | |
| JP | 1-130131 | 5/1989 | | | | | |
| JP | 1-156725 | 6/1989 | | | | | |
| JP | 1-321073 | 6/1989 | | | | | |
| JP | 01-183845 | 7/1989 | | | | | |
| JP | 01-183853 | 7/1989 | | | | | |
| JP | 01-194351 | 8/1989 | | | | | |
| JP | 01-241862 | 9/1989 | | | | | |
| JP | 01-274117 | 11/1989 | | | | | |
| JP | 01-289917 | 11/1989 | | | | | |
| JP | 02-002522 | 1/1990 | | | | | |
| JP | 02-016596 | 1/1990 | | | | | |
| JP | 2-27320 | 1/1990 | | | | | |
| JP | 2-051129 | 2/1990 | | | | | |
| JP | 2-90683 | 3/1990 | | | | | |
| JP | 2-103925 | 4/1990 | | | | | |
| JP | 02-159730 | 6/1990 | | | | | |
| JP | 2-188723 | 7/1990 | | | | | |
| JP | 02-199498 | 8/1990 | | | | | |
| JP | 2-210330 | 8/1990 | | | | | |
| JP | 02-211428 | 8/1990 | | | | | |
| JP | 02-228041 | 9/1990 | | | | | |
| JP | 02-228042 | 9/1990 | | | | | |
| JP | 2-234134 | 9/1990 | | | | | |
| JP | 02-234134 | 9/1990 | | | | | |
| JP | 02-278749 | 11/1990 | | | | | |
| JP | 02-281291 | 11/1990 | | | | | |

OTHER PUBLICATIONS

Wallmark et al., "Field-Effect Transistors Physics, Technology and Applications," 1968.

Cobbold, "Theory and Applications of Field-Effect Transistors," 1971.

Millman et al., "Microelectronics Second Edition," McGraw-Hill Book Company, 1988, p. 143.

Author Unknown, "Driving Method for TFT/LCD Grayscale," pp. 384-385, Nov. 1990, IBM Technical Disclosure Bulletin, vol. 33, No. 6B, New York, XP000108914.

Montgomery et al., "Improving Multiplexability for Polymer-Dispersed Liquid Crystal Films by Dual Frequency Addressing," pp. 67-74, Aug. 1990, Molecular Crystals and Liquid Crystals (Inc. Nonlinear Optics), vol. 185, XP0001692922.

Millman et al., "Microelectronics," pp. 143, 1988, McGraw-Hill Book Company, Second Edition, no month cited.

T. Yanagisawa et al., "An MOS Array with Platinum Display Electrodes for Reflective Dynamic Scattering LCDs", SID 81 DIGEST, pp. 110-111, 1981 (English).

Y. Oana et al., "A 240×360 Element Active Matrix LCD with Integrated Gate-Bus Drivers Using Poly-Si TFTs", SID 84 DIGEST, pp., 312-315, Jan. 6, 1984 (English).

U.S. Appl. No. 08/372,899, filed Jan. 17, 1995, including specification, abstract, claims as filed, and pending claims.

U.S. Appl. No. 08/943,238 filed, Oct. 1, 1997, including specification, abstract, claims as filed, and pending claims.

U.S. Appl. No. 09/288,140 filed, Apr. 8, 1999, including specification, abstract, claims as filed, and pending claims.

U.S. Appl. No. 09/288,509 filed, Apr. 8, 1999, including specification, abstract, claims as filed, and pending claims.

U.S. Appl. No. 09/285,899 filed, Apr. 8, 1999, including specification, abstract, claims as filed, and pending claims.

U.S. Appl. No. 09/300,596 filed, Apr. 28, 1999, including specification, abstract, claims as filed, and pending claims.

U.S. Appl. No. 09/323,692 filed, Jun. 2, 1999, including specification, abstract, claims as filed, and pending claims.

* cited by examiner

Fig. 5
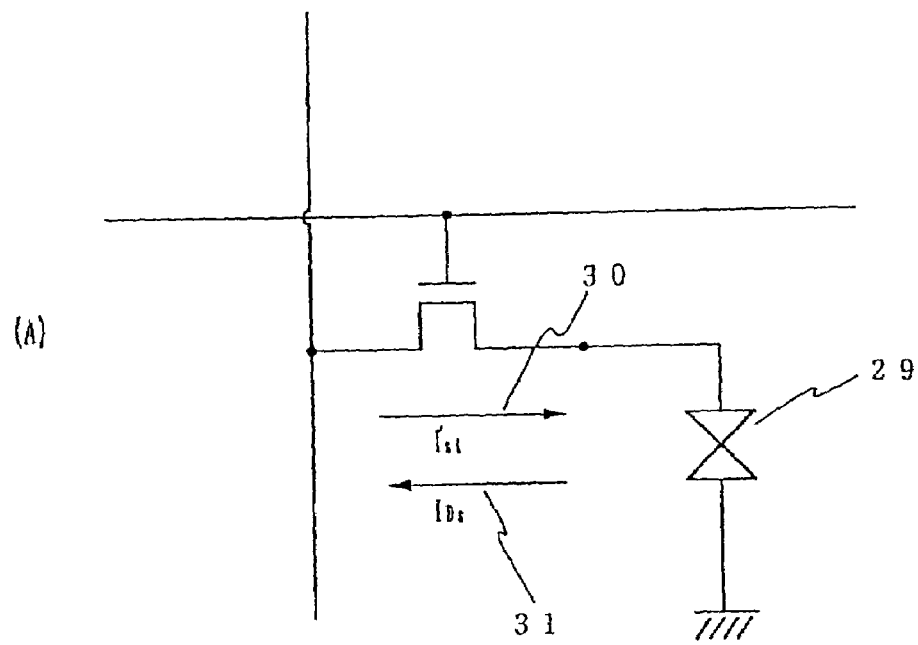
(A)
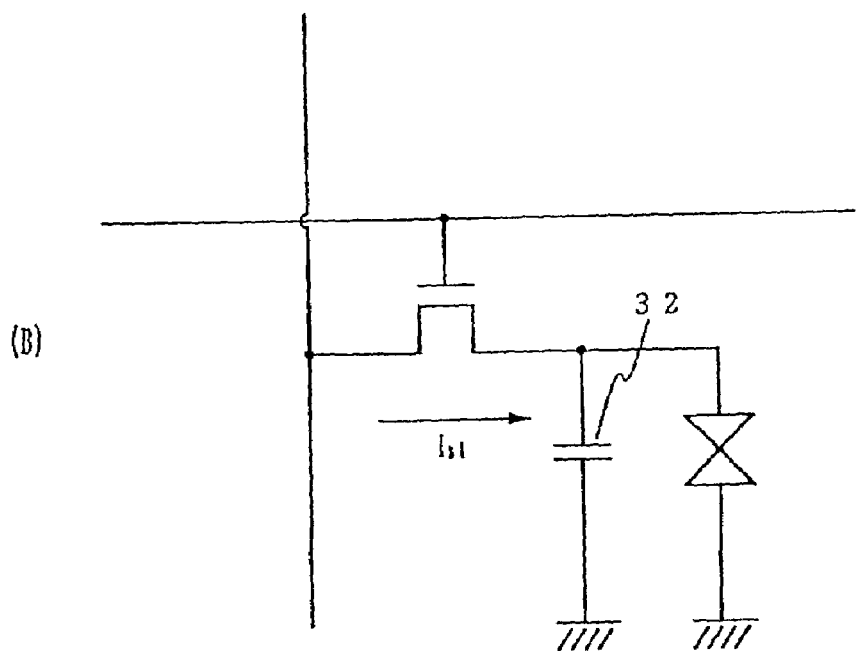
(B)

Fig. 15
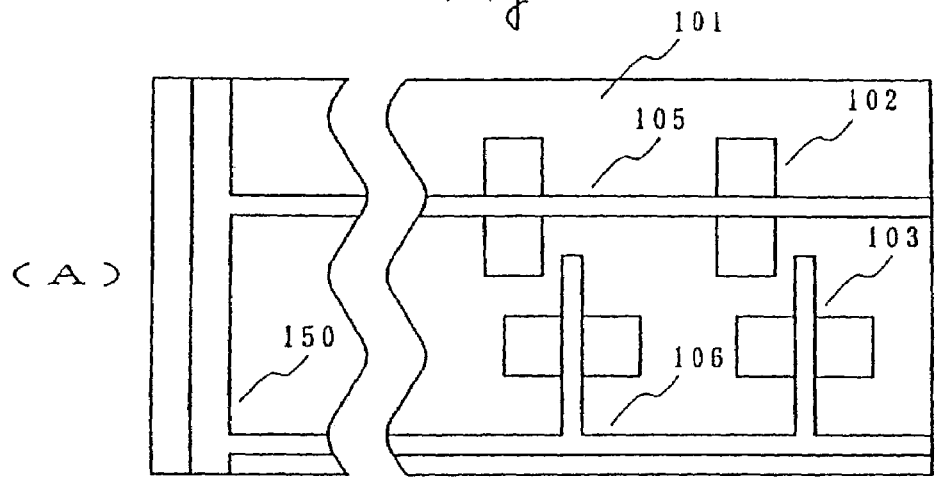
(A)
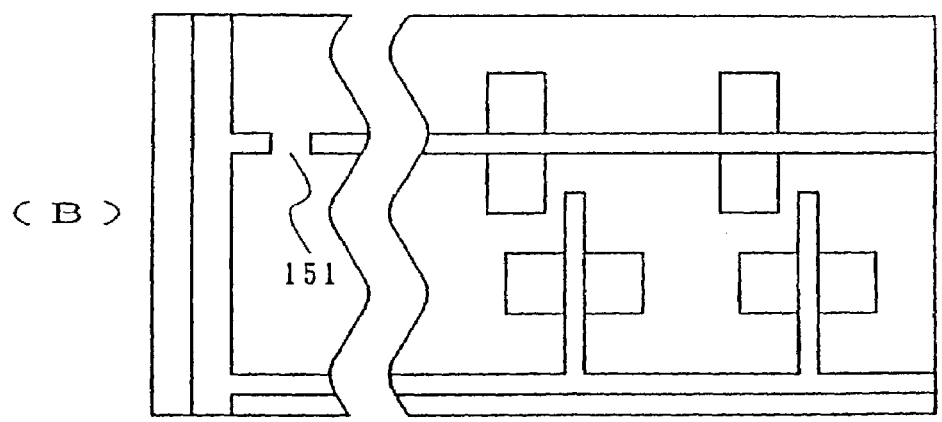
(B)
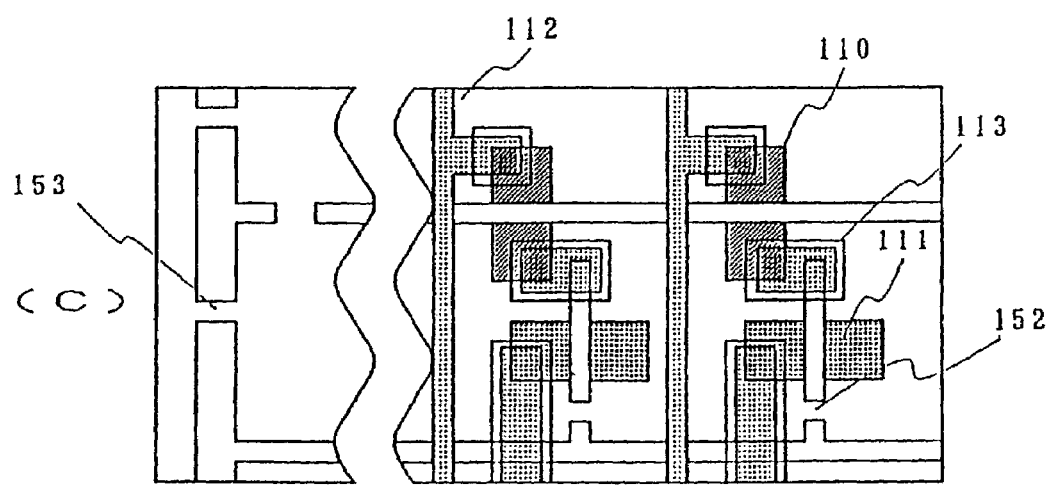
(C)

Fig. 17
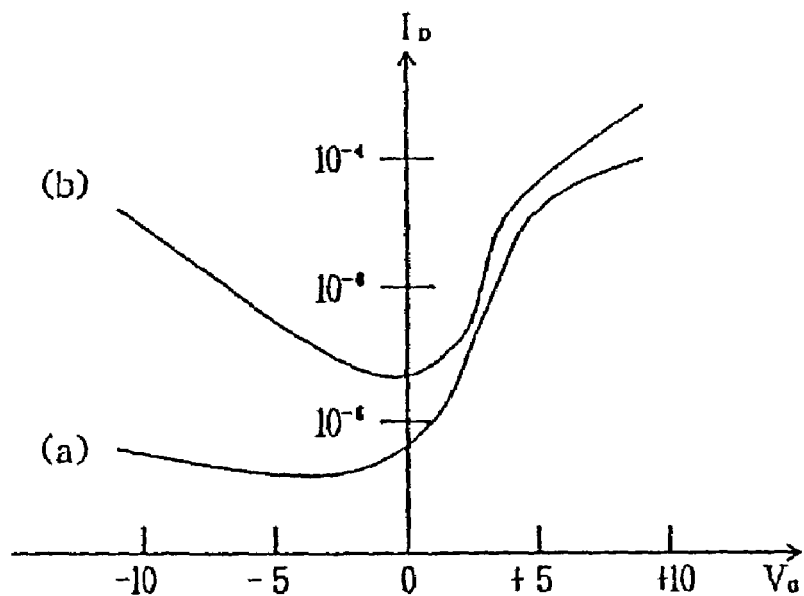
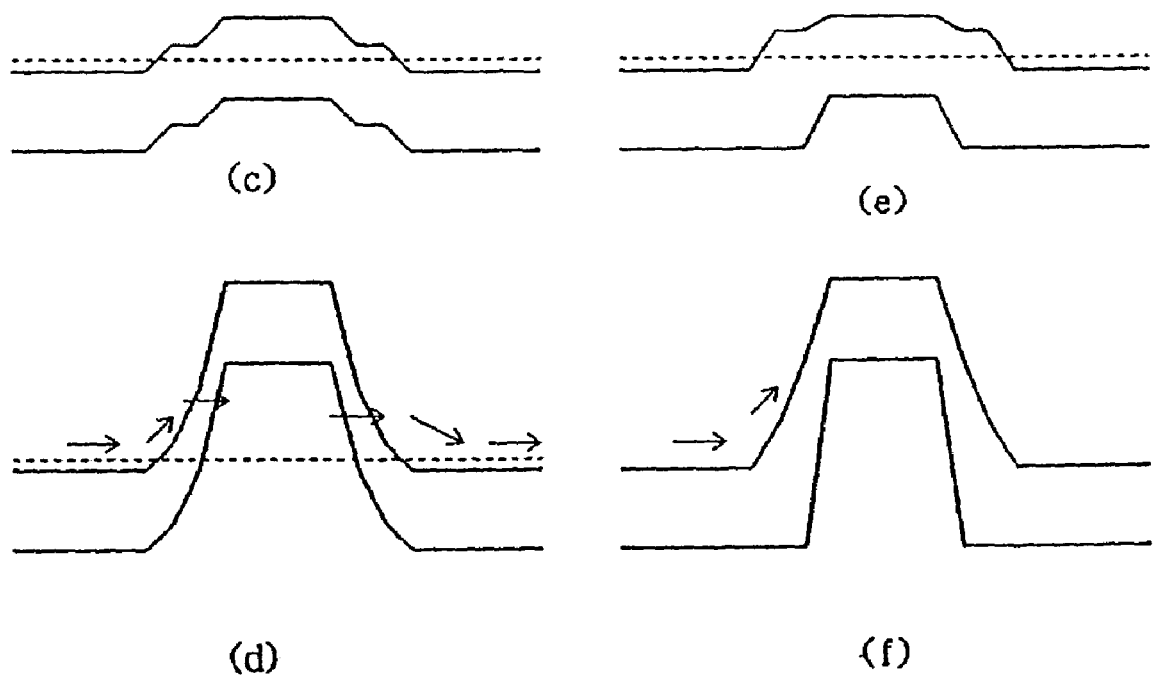
(c)          (e)
(d)          (f)

Fig. 21
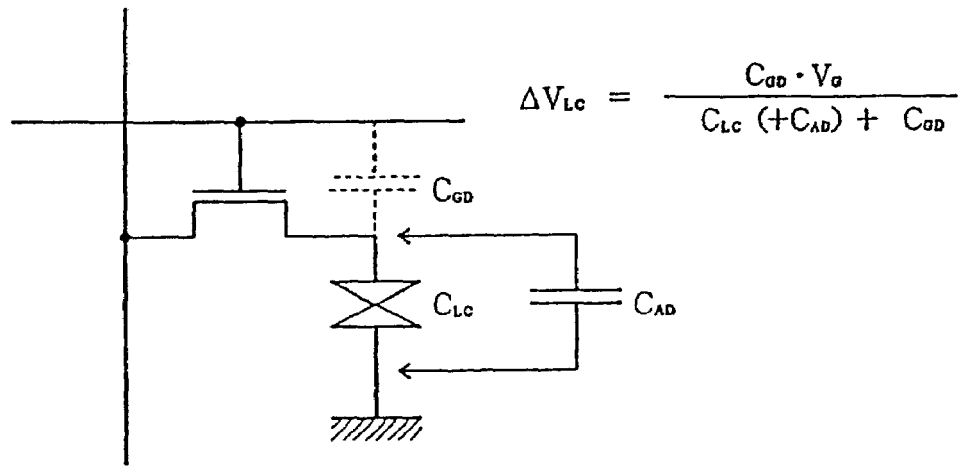
(A)
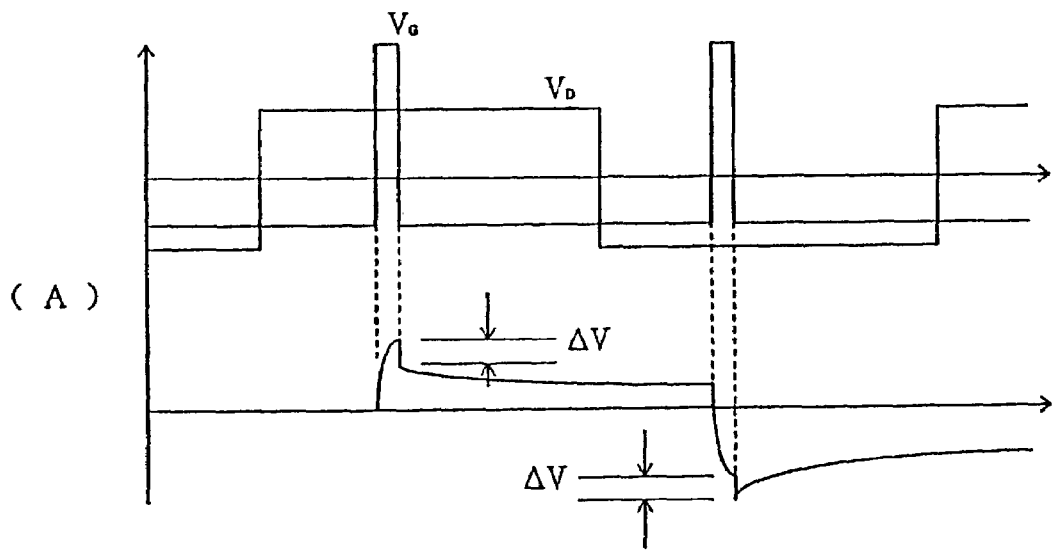
(B)
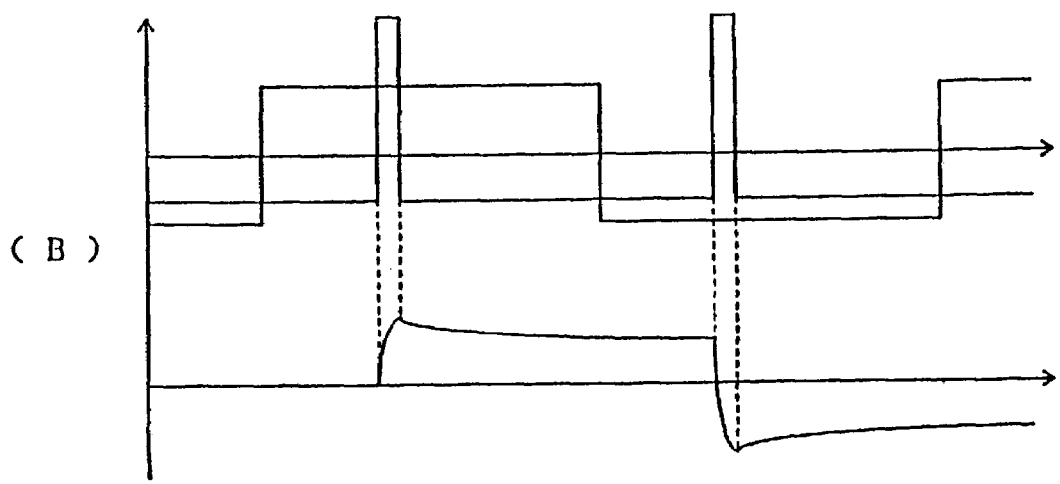

Fig. 22
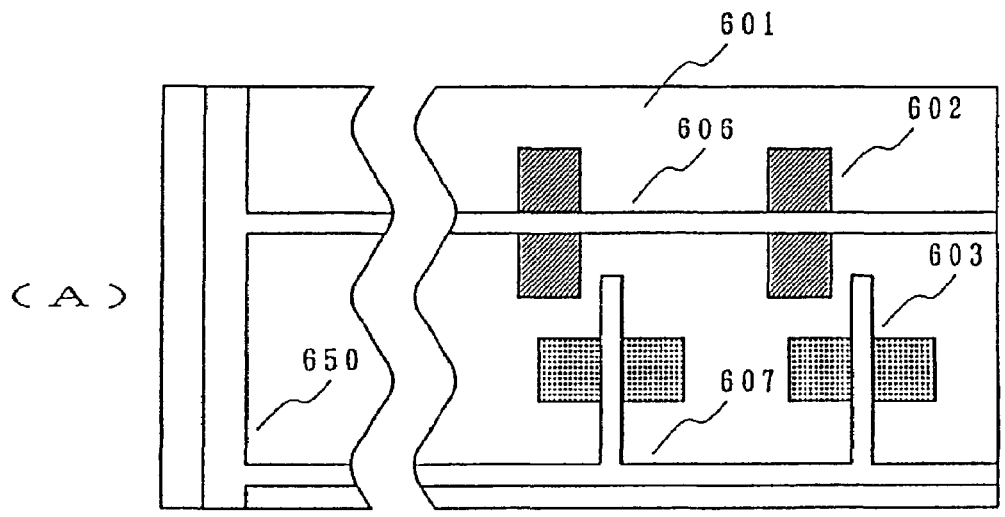
(A)
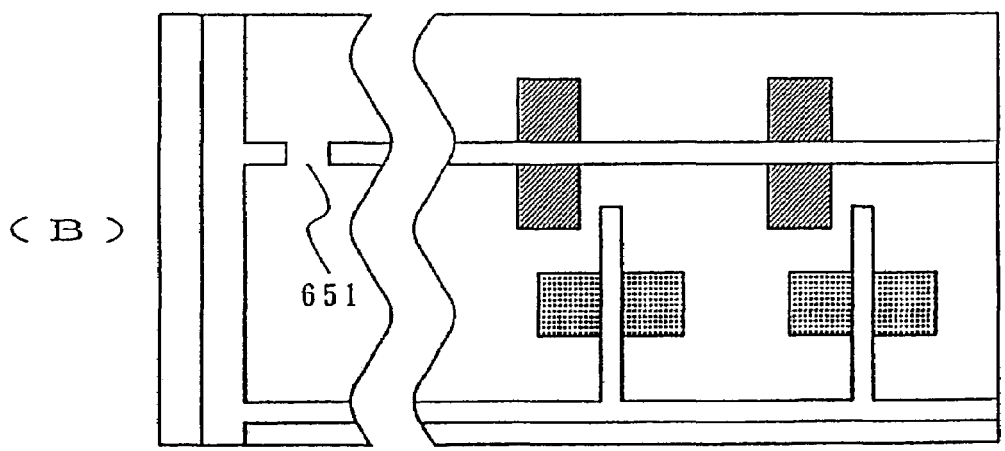
(B)
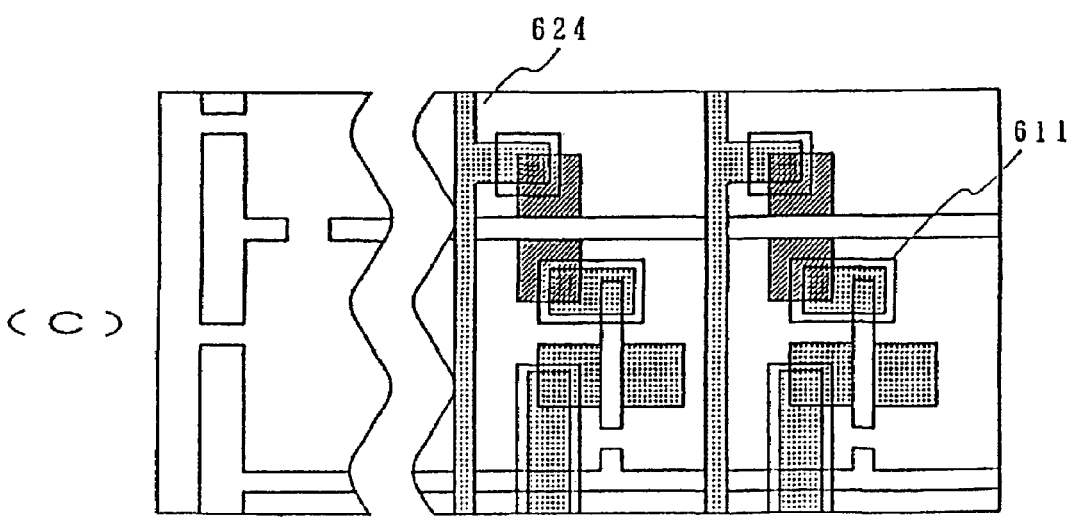
(C)

SEMICONDUCTOR DISPLAY DEVICE

FIELD OF THE INVENTION

The present invention relates to an active-matrix electro-optical device and, more particularly, to a field-effect transistor which can be applied to an active-matrix liquid-crystal electro-optical device or the like and has definite switching characteristics. Also, the invention relates to a method of fabricating such a field-effect transistor.

BACKGROUND OF THE INVENTION

The prior art thin-film insulated-gate field-effect transistor used in an active-matrix liquid-crystal electro-optical device is constructed as shown in FIG. 2. A blocking layer 9 is formed on an insulating substrate 9. A semiconductor layer having a source 4, a drain 5, and a channel region 3 is formed on the blocking layer 8. A gate-insulating film 2 and a gate electrode 1 are laminated on the semiconductor layer. An interlayer insulating film 12 is formed on the gate-insulating film 2 and on the gate electrode 1. A source electrode 6 and a drain electrode 7 are formed on the interlayer insulating film 12 and on the semiconductor layer.

This prior art insulated-gate FET is manufactured in the sequence described now. First, the blocking layer 8 is formed on the glass substrate 9 by sputtering while using $SiO_2$ as a target. Then, the semiconductor layer is formed by plasma-assisted CVD and patterned to form the semiconductor layer which will have the source, drain, and channel region. Then, silicon oxide is sputtered to form the gate-insulating film 2. Subsequently, an electrically conductive layer which is heavily doped with phosphorus and used to form the gate electrode is formed by low-pressure CVD. The conductive layer is then patterned to form the gate electrode 1. Thereafter, dopant ions are implanted while using the gate electrode as a mask, so that the source 4 and the drain 5 are fabricated. Then, the laminate is thermally treated to activate it.

In the insulated-gate FET fabricated in this way, the length of the gate electrode 1 taken in the longitudinal direction of the channel is substantially identical with the channel length, indicated by 10. In the case of the n-channel structure, the current-voltage characteristic of the FET of this structure is shown in FIG. 3. This FET has the disadvantage that in the reverse bias region 13, the leakage current increases with increasing the voltage applied between the source and drain. Where this device is used in an active-matrix liquid-crystal electro-optical device, if the leakage current increases in this way, the electric charge stored in a liquid crystal 29 by a writing current 30 is discharged as a leakage current 31 through the leaking portion of the device during the non-writing period, as shown in FIG. 5(A). In this manner, it has been impossible to obtain good contrast.

A conventional method of solving this problem is to add a capacitor 32 for holding electric charge, as shown in FIG. 5(B). However, in order to form such capacitors, capacitive electrodes made of metal interconnects are needed. This results in a decrease in the aperture ratio. Also, it is reported that the aperture ratio is improved by fabricating the capacitors from transparent electrodes of ITO. Nonetheless, this scheme necessitates an excess process and hence has not enjoyed popularity.

Where only one of the source and drain of this insulated-gate FET is connected with a capacitive device or a capacitor and this transistor is used as a switching device, e.g., in the case of a well-known dynamic random access memory (DRAM) of the 1 transistor/cell type or in the case of an active liquid crystal display having pixels each of which has the circuit shown in FIG. 5(A) or 5(B), it is known that the voltage at the capacitor device is varied by the existence of a parasitic capacitance between the gate electrode and the drain or source.

The variation V in this voltage is in proportion to the gate voltage $V_G$ and to the parasitic capacitance and is in inverse proportion to the sum of the capacitance of the capacitive device and the parasitic capacitance. Therefore, it is customary to fabricate the transistor by the self-aligning technology to reduce the parasitic capacitance, thus suppressing variations in the voltage. However, as the dimensions of devices decrease, the contribution of the parasitic capacitance becomes so large that it can no longer be neglected even if the self-aligning process is exploited.

In an attempt to reduce the variation V, a new method has been proposed. In particular, as shown in FIG. 5(B), a capacitor other than the proper capacitive device is connected in parallel to increase the apparent capacitance of the capacitive device. As described previously, however, the increase in the area of the capacitor cannot be neglected for DRAMs. The decrease in the numerical aperture cannot be neglected for liquid-crystal displays.

SUMMARY OF THE INVENTION

It is an object of the present invention to provide an insulated-gate FET free of the foregoing problems.

The above object is achieved by an insulated-gate FET in which the channel length, i.e., the distance between the source region and the drain region, is made larger than the length of the gate electrode taken in the longitudinal direction of the channel (the direction of the channel length), whereby offset regions are formed in those portions of the channel regions which are in contact with the source and drain regions, respectively. The offset regions undergo no or very weak electric field from the gate electrode. The current-voltage characteristic of this device is shown in FIG. 4.

It is another object of the invention to provide a method for forming the insulated-gate FET described in the preceding paragraph.

Other objects and features of the invention will appear in the course of the description thereof which follows.

BRIEF DESCRIPTION OF THE DRAWINGS

FIGS. 5, (A) and (B), are circuit diagrams of portions of conventional active-matrix liquid-crystal electro-optical devices;

FIG. 15, (A)-(C), are top views of the thin-film transistor shown in FIG. 14, (A)-(D), illustrating the sequence in which the device is fabricated;

FIGS. 17, (a) and (b), are graphs showing characteristics of thin-film transistors;

FIG. 17, (c)-(f), are diagrams illustrating the principle of operation of thin-film transistors according to the invention;

FIG. 21 is a circuit diagram of a portion of an active-matrix liquid-crystal electro-optical device according to Example 7;

FIGS. 21(A) and 21(B) are diagrams illustrating the operation of the active-matrix liquid-crystal electro-optical device shown in FIG. 21;

FIG. 22, (A)-(C), are top views of a thin-film transistor according to Example 6, illustrating the sequence in which the device is fabricated.

DETAILED DESCRIPTION OF THE INVENTION

Figure 1:
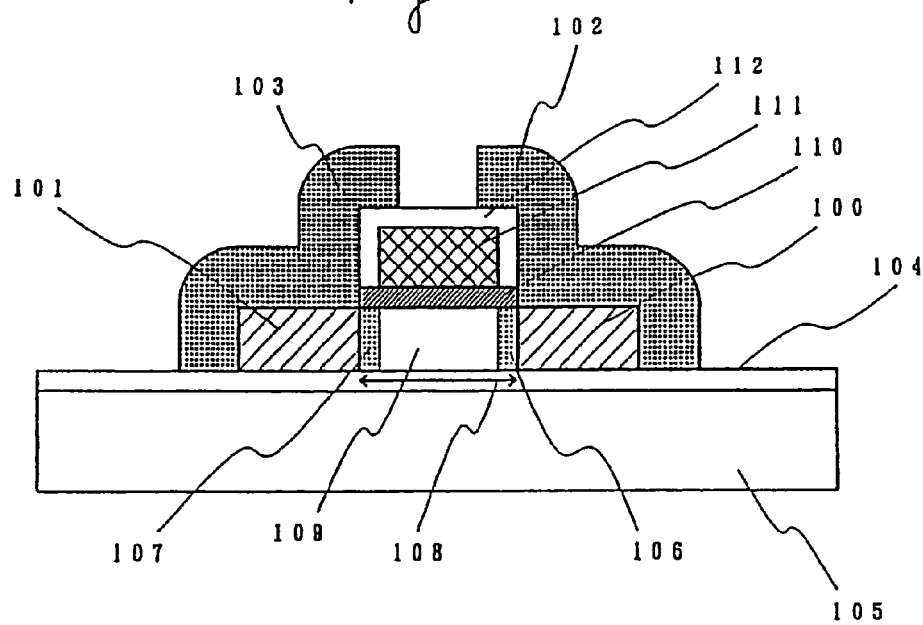
FIG. 1 is a cross-sectional view of a semiconductor device according to the invention.
Figure 2:
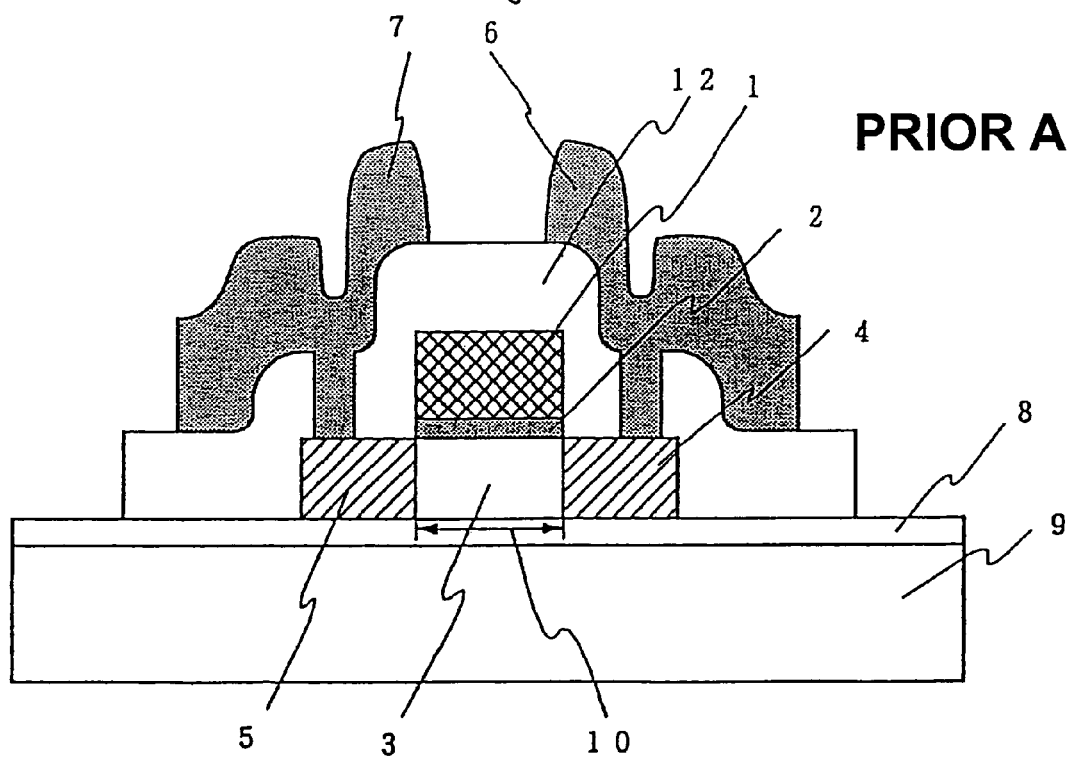
FIG. 2 is a cross-sectional view of a conventional semiconductor device.
Figure 3:
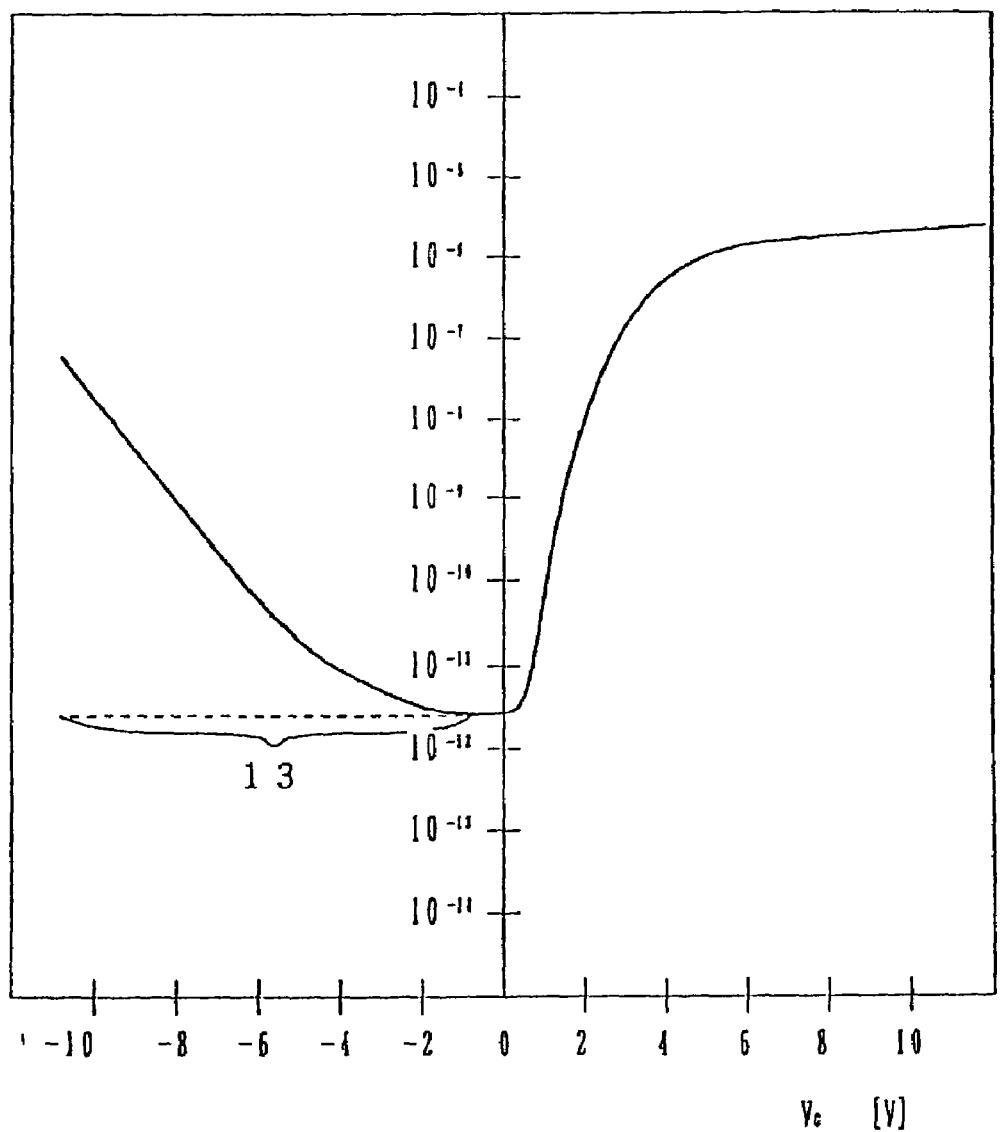
FIG. 3 is a graph showing the current-voltage characteristic of the conventional semiconductor device shown in FIG. 2.
Figure 4:
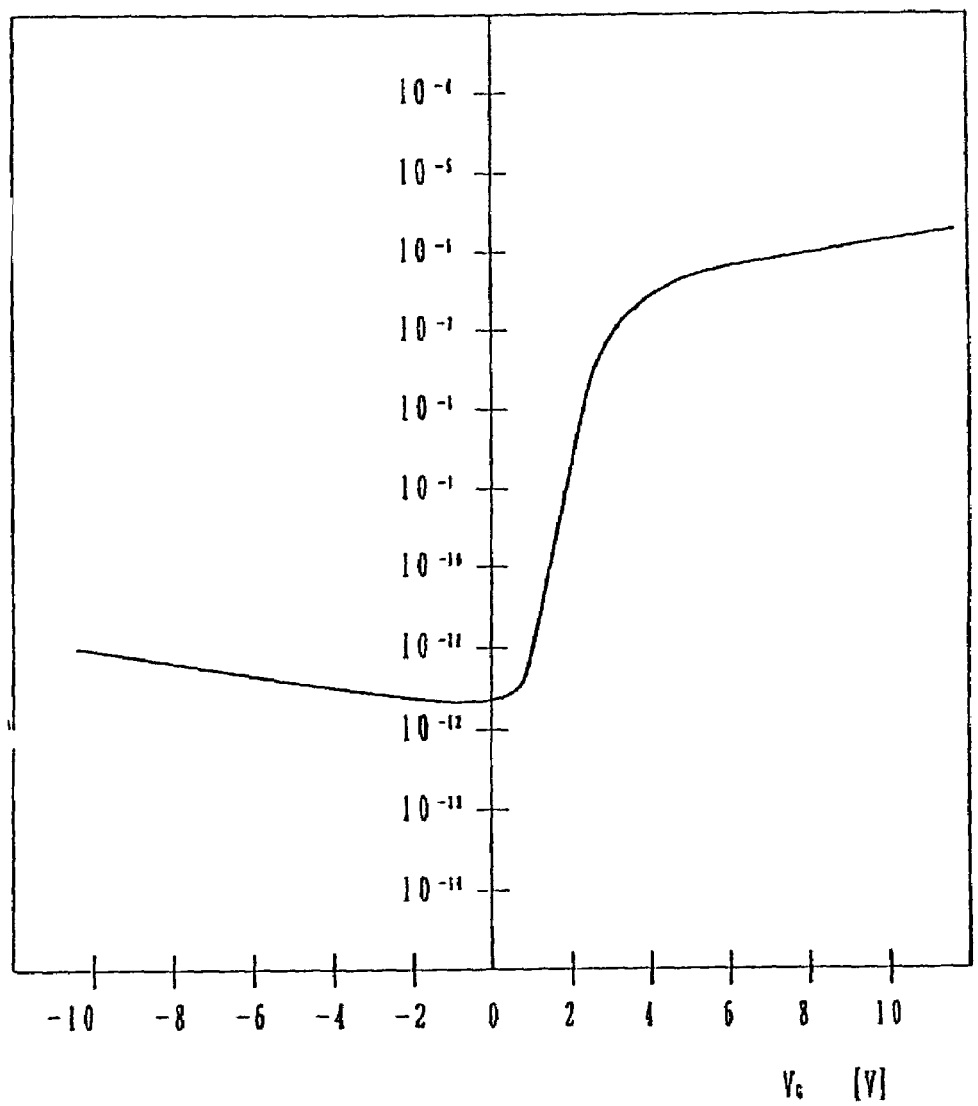
FIG. 4 is a graph showing the current-voltage characteristic of the novel semiconductor device shown in FIG. 1.

Referring to FIG. 1, the fundamental structure of a field-effect transistor according to the invention is shown. This transistor has an insulating substrate 105 and a blocking layer 104 formed on the substrate 105. A semiconductor layer which becomes a source region 100, a drain region 101, and a channel region 109 is formed on the blocking layer 104. A gate-insulating film 110 is formed on the channel region 109. A gate electrode 111 is formed on the gate-insulating film 110. An oxide layer 112 which is an insulating layer is formed on the gate electrode 111. The oxide layer 112 is formed by anodizing a material which can be anodized. A source electrode 102 and a drain electrode 103 are formed so as to be in contact with the source region and the drain region, respectively. No interlayer insulator is shown in FIG. 1, but where the parasitic capacitance between the gate electrode or the interconnects to this gate and the source, the drain, or the interconnects to the source or drain poses a problem, an interlayer insulator may be formed in the same way as in the prior art techniques. Examples of this will be described later.

Referring still to FIG. 1, the gate electrode portion which becomes the gate electrode 111 and the oxide layer 112 is made of a material that can be anodized. The surface portion of the gate electrode portion is anodized to form the oxide layer 112. The distance between the source region 100 and the drain region 101 which are to be implanted with ions, i.e., the channel length 108, is larger than the substantial length of the gate electrode 111 taken in the longitudinal direction of the channel by a length which is about twice as large as the thickness of the oxide layer 112. The gate electrode portion comprises metal or semiconductor. Chiefly, the material of the gate electrode portion is one selected from titanium (Ti), aluminum (Al), tantalum (Ta), chromium (Cr), and silicon (Si). Alternatively, the gate electrode portion is made of an alloy of some of these materials.

As a result, those portions 106 and 107 of the channel region 109 which are on the opposite sides of the gate-insulating film 110 from the portions of the oxide layer 112 formed on both sides of the gate electrode receive no electric field from the gate electrode or experience much weaker field than the portions immediately under the gate electrode. These regions 106 and 107 are hereinafter, especially where they are comparable to the channel region in crystallinity and dose, referred to as the offset regions.

These regions 106 and 107 can be made of doped amorphous materials. More strictly, it is only necessary that the regions 106 and 107 be inferior in crystallinity to the adjacent source region 100 and drain region 101. For example, if the source region 100 and the drain region 101 consist of polysilicon having large crystal grains, then it is only necessary that the regions 106 and 107 be made of amorphous silicon or semi-amorphous silicon that is slightly superior in crystallinity to amorphous silicon. If the regions 100 and 101 are made of semi-amorphous silicon, the regions 106 and 107 can be made of amorphous silicon. Of course, these amorphous materials are required to be sufficiently treated so that they behave as semiconductors. As an example, in order to minimize dangling bonds, it is necessary that these bonds be sufficiently terminated by hydrogen or a halogen element.

A good TFT (thin-film transistor) characteristic as shown in FIG. 17(a) could be obtained by forming these amorphous regions. FIG. 17(b) shows the current-voltage characteristic of a thin-film transistor of the prior art insulated-gate transistor structure. As can be seen by comparing these characteristic curves, very large leakage current was observed in the reverse direction when the prior art method was used. In accordance with the present invention, substantially amorphous regions are formed, thus improving the characteristic. That is, formation of doped amorphous regions yields the same advantages as the formation of the previously described offset regions.

Why the formation of the amorphous regions improves the characteristic is not fully understood. One possible cause is as follows. In the amorphous regions, the added dopant element is ionized at a lower rate than in the crystal regions. Therefore, if dopants are added at the same dose, the amorphous regions behave as though they had lower dopant concentrations. That is, regions substantially similar to lightly doped drains are formed. For instance, the ionization rate of silicon in amorphous state is 0.1–10% at room temperature, which is much lower than the ionization rate of almost 100% of single-crystal or polycrystal semiconductors.

Another possible cause is that the bandgap in amorphous state is larger than the bandgap in crystalline state. For example, this can be explained away by the energy band diagrams of FIG. 17, (e) and (f). In transistors of normal, lightly doped drain structure, the energy bands between the source, channel, and drain are shown in FIG. 17, (c) and (d). The central raised portion indicates the channel region. The staircase portions indicate lightly doped drain regions. FIG. 17(c) indicates the case in which no voltage is applied to the gate electrode. When a large negative voltage is applied to the gate electrode, the condition shown in FIG. 17(d) appears. At this time, forbidden bands exist between the source and the channel region and between the channel region and the drain to thereby inhibit movement of carries such as electrons and holes. However, the carriers pass across the gap by the tunnel effect or by hopping the trap level within the bandgap. In normal thin-film transistors (TFTs) which are not of the lightly doped drain structure, the gap width is smaller and so electric current flows more easily. This is considered to be the leakage in the reverse direction. This phenomenon is especially conspicuous for TFTs and possibly caused by numerous trap levels due to grain boundaries because TFTs are made of inhomogeneous materials such as polycrystals.

Where the bandgap in the lightly doped drain region is increased, the above-described leakage in the reverse direction decreases. This example is shown in FIG. 17, (e) and (f). FIG. 17(e) shows the condition in which no voltage is applied to the gate. FIG. 17(f) shows the condition in which a large negative voltage is applied to the gate. When a negative voltage is applied as shown in FIG. 17(f), the width of the gap between the source and channel region and the width of the gap between the channel region and the drain are larger than those in case of FIG. 17(d), as can be seen by comparing FIG. 17(f) with FIG. 17(d). The tunnel effect is affected greatly by the width of the tunnel barrier (in this case the width of the gap). The probability that carriers tunnel through the gap is reduced greatly with increasing the width of the gap slightly. Also, hopping via local energy levels is a composite tunnel effect and, therefore, if the width of the gap increases, the probability drops drastically. For these reasons, formation of lightly doped drain regions having large bandgaps is considered as advantageous. The bandgaps of amorphous silicon is 1.5 to 1.8 eV, while the bandgap of polycrystalline silicon is 1.1 eV. If materials having such wide bandgaps are used in lightly doped drains, a quite ideal situation occurs.

To fabricate a semiconductor device in accordance with the present invention, especially a semiconductor device having the aforementioned offset regions, the gate electrode portion is formed out of a material capable of being anodized after the semiconductor layer becoming the source, drain, and the channel region and the gate-insulating layer 110 are formed. Subsequently, dopant ions which impart p- or n-type to the semiconductor layer are implanted into this semiconductor layer to form the source region 100 and the drain region 101. Thereafter, the surface of the gate electrode portion is anodized (anodic oxidized) to form the gate electrode 111 and the oxide layer 112. Thereafter, a thermal treatment or other step is carried out.

Alternatively, after forming the semiconductor layer and the gate-insulating layer 110, the gate electrode portion is fabricated out of a material that can be anodized, followed by anodization (anodic oxidation) of the surface of the gate electrode portion to form the gate electrode 111 and the oxide layer 112. Then, dopant ions are implanted into the semiconductor layer to impart p- or n-type to it, forming the source region 100 and the drain region 101. Thereafter, a thermal treatment is effected.

By carrying out these steps, insulated-gate FETs in which the channel length is greater than the length of the gate electrode taken in the longitudinal direction of the channel can be easily and certainly fabricated without producing variations in the performance which would otherwise be caused by mask misalignment.

Another method of fabricating the novel semiconductor device having amorphous regions is initiated by forming the semiconductor layer becoming the source, drain, and channel region and the gate-insulating layer 110. Then, the gate electrode portion is fabricated from a material that can be anodized. Subsequently, dopant ions are implanted so that the semiconductor layer is doped p- or n-type. As a result, the semiconductor layer is made amorphous. The source region 100, the drain region 101, and their adjacent amorphous regions 106 and 107 are formed. Thereafter, the surface portion of the gate electrode portion is anodized to form the gate electrode 111 and the oxide layer 112. At this time, the surface of the gate electrode is made to retreat by the oxidation. Then, only the source region 100 and the drain region 101 may be recrystallized while using the gate electrode portion as a mask by a self-aligning process employing laser annealing or flash lamp annealing techniques. This process is of the self-aligning type, because the gate electrode portion shades the underlying doped regions located under the gate electrode portion, thus inhibiting recrystallization of these doped regions.

Where an ion implantation process is utilized, the spreading of the doped regions due to secondary diffusion of ions can be calculated from the acceleration energy of the ions. Also, the retreat of the gate electrode is determined by the thickness of the oxide layer and so the retreat is also taken as a design parameter. In accordance with the present invention, the positional relation between the gate electrode and the doped regions can be optimized by accurate design. In particular, the thickness of the oxide layer can be controlled to tolerances less than 10 nm. Also, the secondary scattering produced during ion implantation can be controlled to tolerances of the same order. Consequently, the positional relation can be controlled to tolerances less than 10 nm during the fabrication.

In this way, the invention requires no further accurate mask alignment. The possibility that the production yield is deteriorated by the invention is low. Rather, the inventive device has greatly improved characteristics. Some examples of the invention are given below.

EXAMPLE 1

Figure 6:
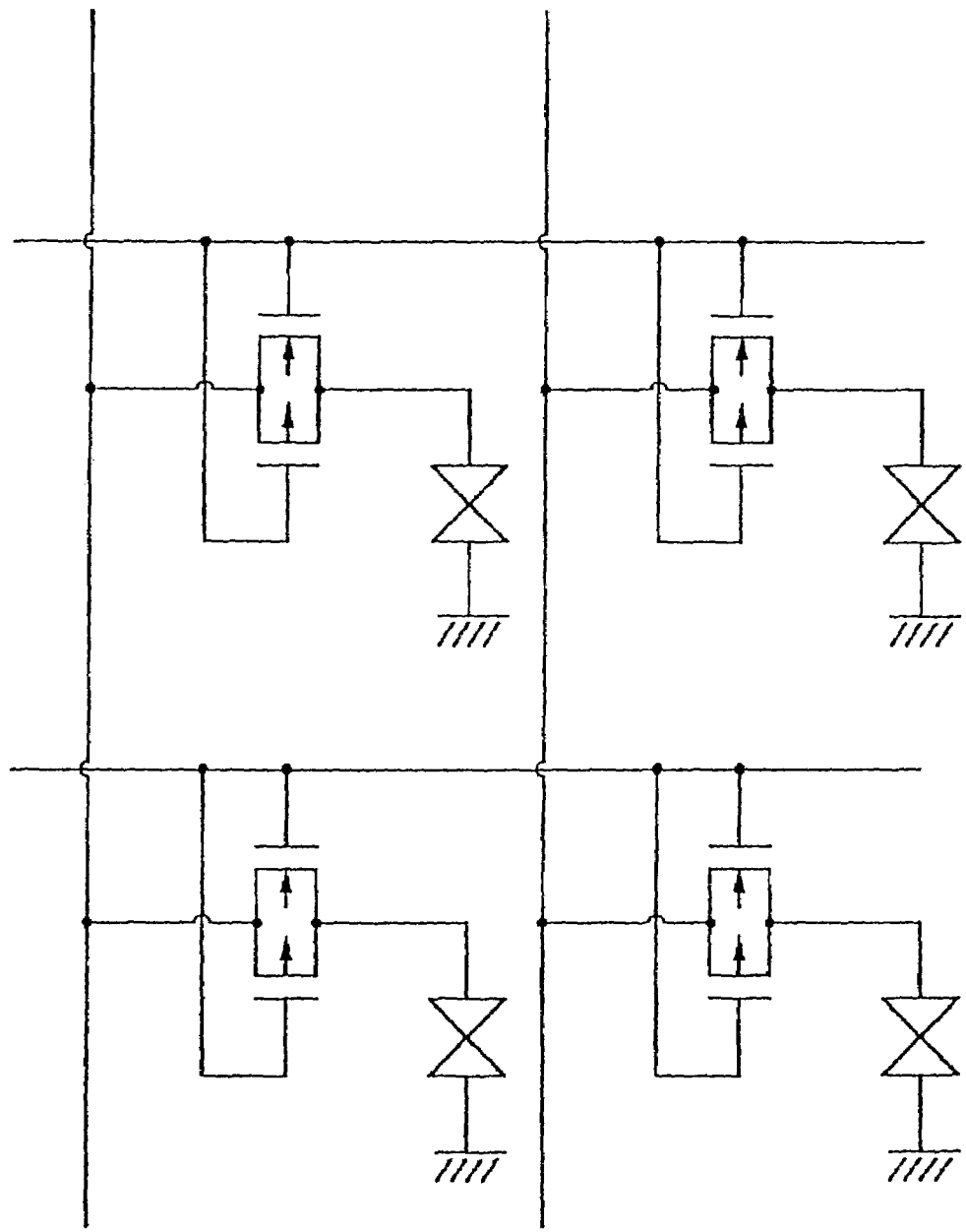
FIG. 6 is a circuit diagram of a portion of an active-matrix liquid-crystal electro-optical device according to the invention, the device forming Example 1 of the invention.
Figure 7:
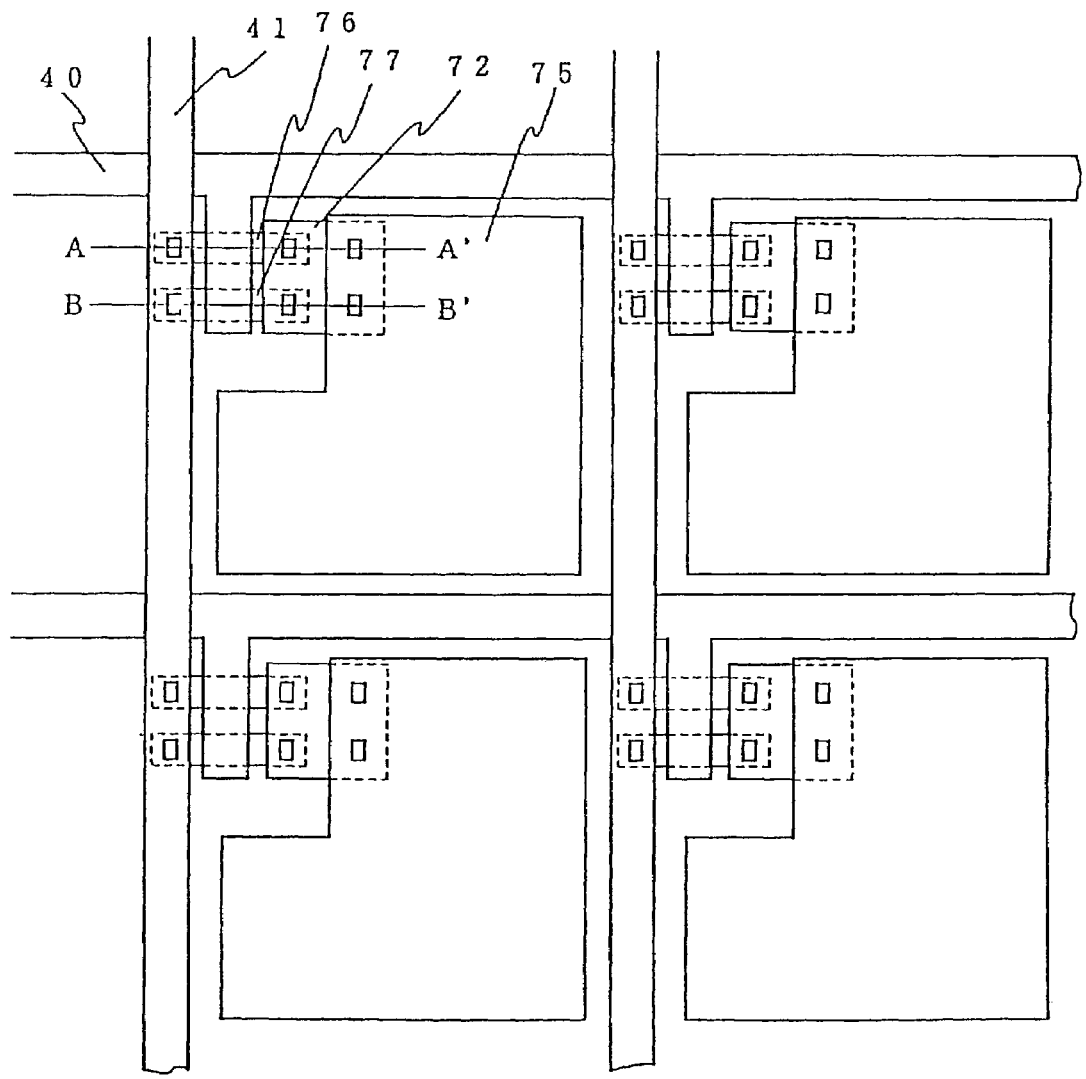
FIG. 7 is a plan view of the portion of the novel active-matrix liquid-crystal electro-optical device shown in FIG. 6.
Figure 8:
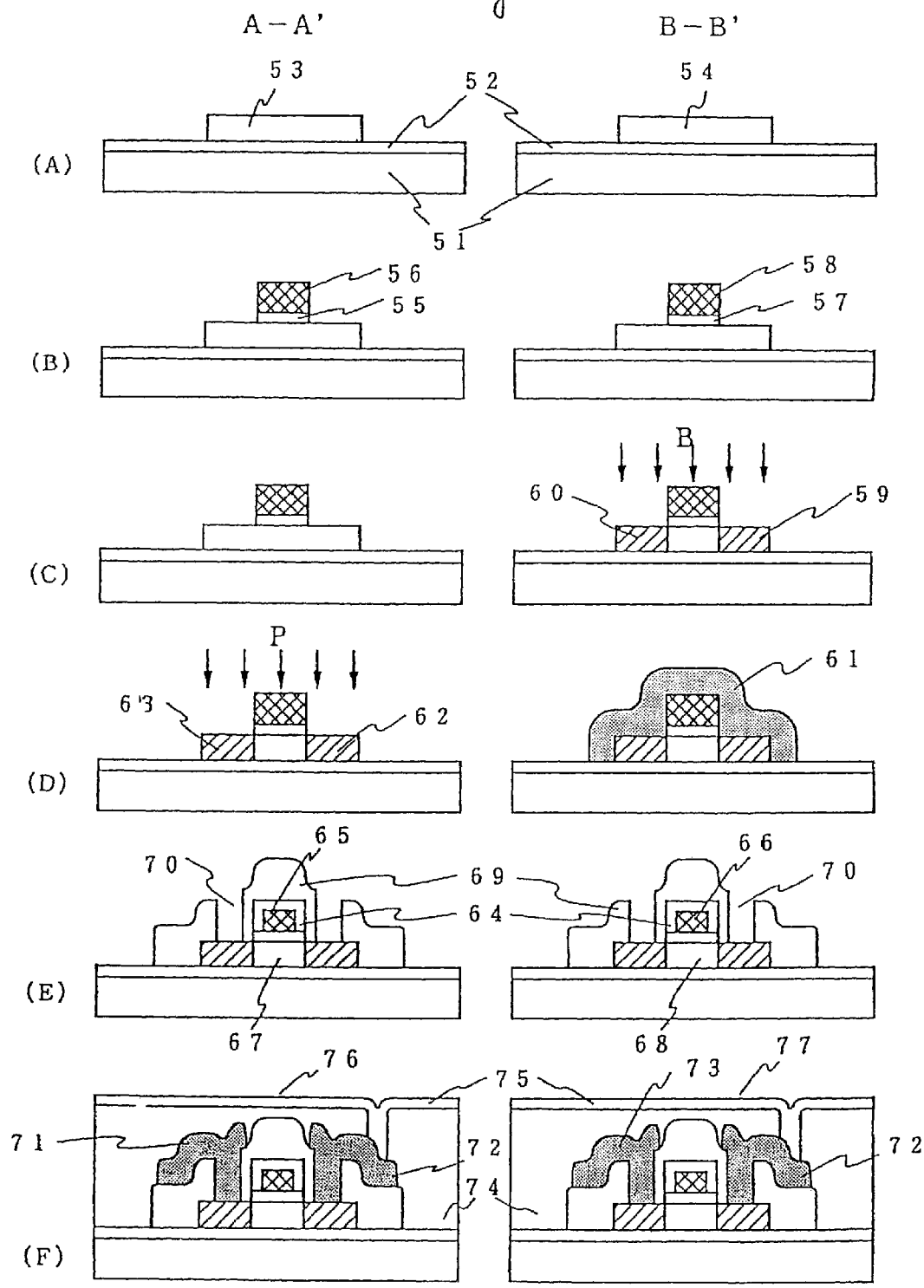
FIG. 8, (A)-(F), are cross-sectional views of a portion of the novel active-matrix liquid-crystal electro-optical device shown in FIGS. 6 and 7, illustrating the sequence in which the device is fabricated.
Figure 23:
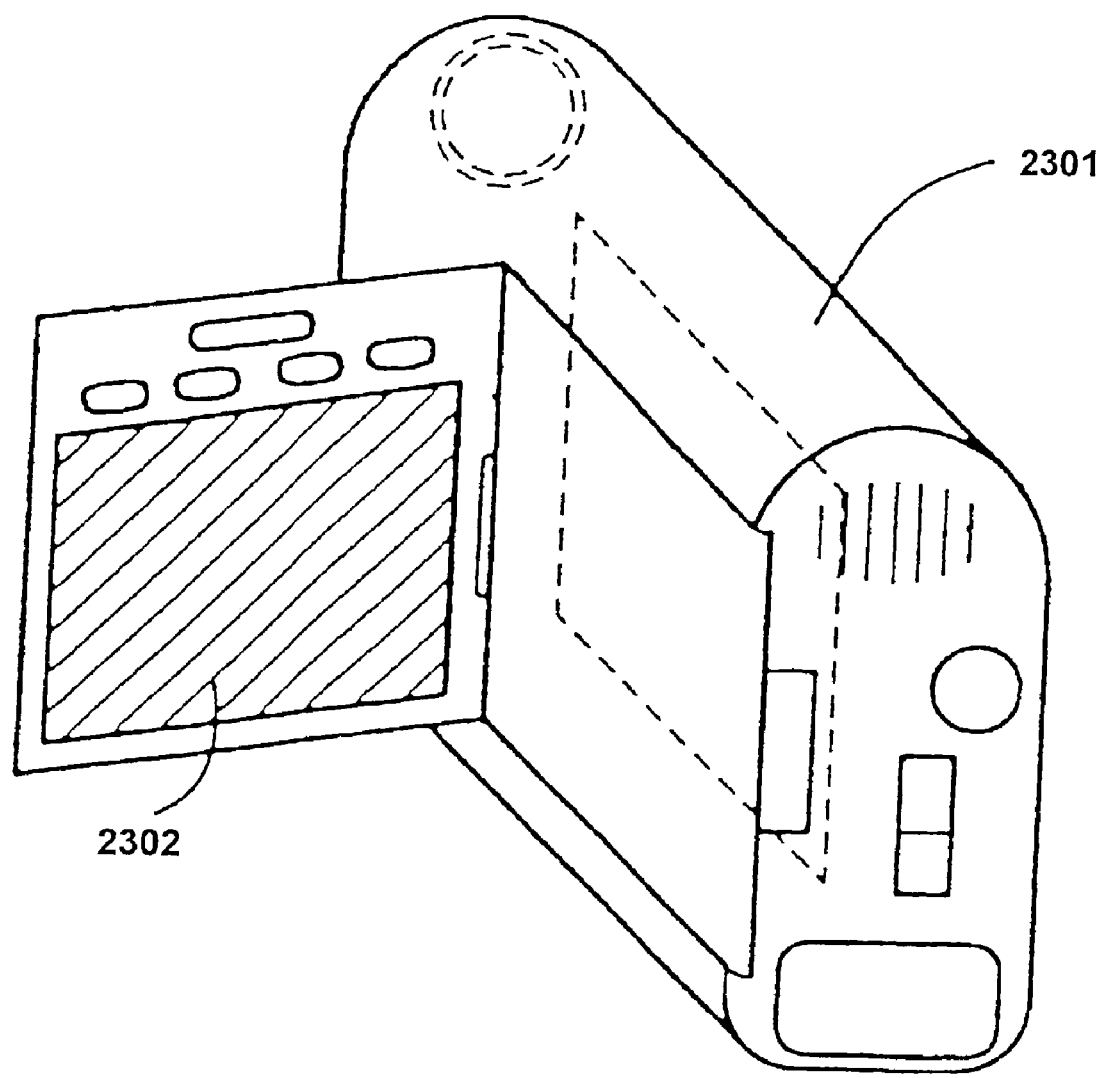
FIG. 23 illustrates a video camera having a viewfinder in accordance with the present invention.

Referring to FIG. 23, a viewfinder 2302 for a video camera 2301, using a liquid-crystal electro-optical device 1 inch in diagonal according to the invention was fabricated. The device had 387×128 pixels. The viewfinder was fabricated from high-mobility TFTs (thin-film transistors) in a low-temperature process. The arrangement of active elements on the substrate of a liquid-crystal electro-optical device used in the present example is shown in FIG. 7. FIG. 6 is a circuit diagram of the present example. The manufacturing steps are shown in FIG. 8, (A)-(F), which are taken along lines A–A' and B–B'. The cross sections taken along the line A–A' show an n-channel TFT. The cross sections taken along the line B–B' show a p-channel TFT.

In FIG. 8(A), a glass substrate 51 was made of an inexpensive material and withstood a thermal treatment below 700° C., e.g., at about 600° C. Silicon oxide was sputtered on the glass substrate 51 to a thickness of 1000 to 3000 Å by a magnetron RF (high frequency) sputtering process to form a blocking layer 52. The ambient was 100% oxygen. The film was formed at 150° C. The output of the magnetron was 400 to 800 W. The pressure was 0.5 Pa. The used target was made of quartz or a single crystal of silicon. The deposition rate was 30 to 100 Å/min.

A film of silicon was formed on this blocking layer 52 by low-pressure CVD (LPCVD), sputtering, or plasma-assisted CVD. Where the film was being formed by low-pressure CVD, disilane ($Si_2H_6$) or trisilane ($Si_3H_8$) was supplied into the CVD equipment at a temperature (e.g., 450 to 550° C.) lower than the crystallization temperature by 100 to 200° C., e.g., at 530° C. The pressure inside the reaction furnace was 30 to 300 Pa. The deposition rate was 50 to 250 Å/min. To make the p-channel and n-channel TFTs have substantially uniform threshold voltage Vth, boron in the form of diborane may be added to the film at a concentration of $1\times10^{15}$ to $1\times10^{18}$ atoms/cm$^3$.

Where the sputtering process was used, the back pressure prior to the sputtering was $1\times10^{-5}$ Pa or less. A single crystal of silicon was used as a target. The process was carried out within an ambient of argon to which 20–80% hydrogen was added. For example, argon accounted for 20%, while hydrogen accounted for 80%. The film was formed at 150° C. The RF frequency was 13.56 MHz. The sputtering output was 400 to 800 W. The pressure was 0.5 Pa.

Where the silicon film was formed by plasma-assisted CVD, the temperature was 300° C., for example. Monosilane ($SiH_4$) or disilane ($Si_2H_6$) was used. This material was introduced into the PCVD equipment. The film was formed while applying RF electric power of 13.56 MHz.

Preferably, the oxygen content of the films formed by these methods are $5\times10^{21}$ atoms/cm$^3$ or less. If this oxygen concentration is high, it is difficult to crystallize the film. As a result, it is necessary to elevate the thermal annealing temperature or to lengthen the thermal annealing time. Conversely, if the oxygen concentration is too low, the leakage current in OFF state is increased due to backlight. Therefore, the appropriate concentration ranges from $4\times10^{19}$ to $4\times10^{21}$ atoms/cm$^3$. The hydrogen concentration was $4\times10^{20}$ atoms/cm$^3$, which was 1 atomic % of the silicon concentration of $4\times10^{22}$ atoms/cm$^3$.

After the amorphous silicon film was formed to a thickness of 500 to 5000 Å, e.g., 1500 Å, by any of the above-described methods, the laminate was thermally treated at a middle temperature of 450 to 700° C. for 12 to 70 hours within a nonoxidizing ambient. For example, the laminate was placed within an ambient of hydrogen at 600° C. Since the amorphous silicon oxide film was formed at the surface of the substrate under the silicon film, no specific nuclei existed during this thermal treatment. Hence, the whole laminate was annealed uniformly. That is, during the formation of the film, it assumed an amorphous structure. Hydrogen was merely mixed into it.

The silicon film was shifted from the amorphous state to a more highly ordered state by the annealing. Portions of the silicon film assumed a crystalline state. Especially, those regions which assumed a comparatively ordered state during the formation of the silicon film tended to crystallize. However, intervening silicon atoms between these highly ordered regions couple together these regions and, therefore, the silicon atoms attract each other. Measurement by laser Raman spectroscopy has shown that peaks shifted toward lower frequencies from the peak 522 cm$^{-1}$ of a single crystal of silicon existed. Calculation from the half-width values has revealed that the apparent particle diameters ranged from 50 to 500 Å. That is, they resembled microcrystallites. In practice, however, there existed numerous crystalline regions, i.e., clusters were produced. These clusters were anchored to each other by the silicon atoms. The resulting coating had a semi-amorphous structure.

As a result, it might be said that substantially no grain boundaries existed in this coating. Since carriers can move easily from cluster to cluster through the anchored locations, the carrier mobility is higher than polycrystalline silicon having clear grain boundaries. More specifically, the Hall mobility ($\mu h$) is 10 to 200 cm$^2$/V·sec. The electron mobility ($\mu e$) is 15 to 300 cm$^2$/V·sec.

If the coating is made polycrystalline by an anneal at a high temperature between 900° C. and 1200° C. rather than by an anneal at a moderate temperature as described above, then the impurities in the coating segregate because of solid-phase growth from nuclei. A large amount of impurities such as oxygen, carbon, and nitrogen is contained in the grain boundaries. The mobility within one crystal is large. However, movement of the carriers is impeded by the barriers formed at the grain boundaries. The result is that it is difficult to obtain a mobility exceeding 10 cm$^2$/V·sec. Therefore, it was necessary that the concentration of oxygen, carbon, nitrogen, and other impurities be a small or very small fraction of the impurity concentration in a semi-amorphous film. In this case, a mobility of 50 to 100 cm$^2$/V·sec was obtained.

The silicon film formed in this way was photo-lithographically etched to form a semiconductor layer 53 for n-channel TFTs and a semiconductor layer 54 for p-channel TFTS. The channel width of the layer 53 was 20 μm. A silicon oxide film which would become a gate-insulating film was formed to a thickness of 500 to 2000 Å, e.g., 1000 Å, under the same conditions as the silicon oxide film forming the blocking layer. A small amount of fluorine could be added during the formation of the silicon oxide film to fix sodium ions.

Then, an aluminum film was formed on the silicon oxide film. The aluminum film was patterned, using a photomask. The result is shown in FIG. 8(B). A gate-insulating film 55 and a gate electrode portion 56 for an n-channel TFT were formed. The length of these film 55 and electrode portion 56, taken in the longitudinal direction of the channel, was 10 μm. That is, the channel length was 10 μm. Similarly, a gate-insulating film 57 and a gate electrode portion 58 for a p-channel TFT were formed. The length of these film 57 and electrode portion 58, taken in the longitudinal direction of the channel was, 7 μm. That is, the channel length was 7 μm. The thickness of the gate electrode portions 56 and 58 was 0.8 μm. In FIG. 8(C), boron (B) was implanted into the source 59 and the drain 60 for the p-channel TFT at a dose of 1 to $5\times10^{15}$ ions/cm$^2$. Then, as shown in FIG. 8(D), a photoresist 61 was formed, using a photomask. Phosphorus (P) was implanted into the source 62 and the drain 63 for the n-channel TFT at a dose of 1 to $5\times10^{15}$ ions/cm$^2$.

Subsequently, the gate electrode portions were anodized. L-tartaric acid was diluted with ethylene glycol to a concentration of 5%, and the pH was adjusted to 7.0±0.2, using ammonia. The laminate was dipped in the solution and connected with the positive terminal of a constant current source. An electrode of platinum was connected to the negative terminal. An increasing voltage was applied while the current was maintained at 20 mA. The oxidation process was continued until the voltage reached 150 V. Then, the oxidation process was continued while the voltage was kept at 150 V until the current was reduced below 0.1 mA. In this way, an aluminum oxide layer 64 was formed on the surfaces of the gate electrode portions 56 and 58, thus giving rise to gate electrodes 65 and 66 for an n-channel TFT and a p-channel TFT, respectively. The thickness of the aluminum oxide layer 64 was 0.3 $\mu$m.

Then, the laminate was again annealed at 600° C. for 10 to 50 hours. The dopants in the source 62 and drain 63 of the n-channel TFT and in the source 59 and drain 60 of the p-channel TFT were activated so that these two kinds of regions doped $n^+$-type and $p^+$-type, respectively. Channel formation regions 67 and 68 were formed as semi-amorphous semiconductors under the gate-insulating films 55 and 57, respectively.

In the present method, the ion implantation of dopants and the anodization around the gate electrodes may be carried out in reverse order.

In this way, the insulating layer made of a metal oxide was formed around the gate electrodes. As a result, the substantial length of each gate electrode was shorter than the channel length by twice the thickness of the insulating film, in this case 0.6 $\mu$m. The formation of the offset regions to which no electric field was applied could reduce the leakage current in reverse bias.

In the present example, two anneals were conducted as shown in FIG. 8, (A) and (E). Depending on the required characteristics, the anneal shown in FIG. 8(A) can be omitted. Both anneals may be carried out in one step illustrated in FIG. 8(E), thus shortening the manufacturing time. In FIG. 8(E), an interlayer insulator 69 was formed by sputtering silicon oxide. This formation of the silicon oxide film can use LPCVD, photo-assisted CVD, or atmospheric-pressure CVD. The interlayer insulator was formed to a thickness of 0.2 to 0.6 $\mu$m, e.g., 0.3 $\mu$m. Subsequently, openings 70 for electrodes were formed, using a photomask. As shown in FIG. 8(F), aluminum was sputtered onto the whole laminate. Leads 71, 73, and contacts 72 were formed, using a photomask. Thereafter, planarizing organic resin 74, e.g., polyimide resin that transmits light, was applied to the laminate. Again, holes for the electrodes were formed, using the photomask.

In order to use the two TFTs as a complementary pair and to connect this pair to one pixel electrode of a liquid-crystal device, an indium tin oxide (ITO) film was formed by sputtering, said one pixel electrode being a transparent electrode. This film was etched, using a photomask, to form electrodes 75. The ITO film was formed at a temperature between room temperature and 150° C. and annealed at 200–400° C. in an ambient of oxygen or atmosphere. In this way, an n-channel TFT 76, a p-channel TFT 77, and the electrodes 75 of a transparent conductive film were formed on the same glass substrate 51. The obtained TFTs exhibited the following electrical characteristics. The mobility of the p-channel TFT was 20 $cm^2$/V·sec, and the threshold voltage Vth was −5.9 V. The mobility of the n-channel TFT was 40 $cm^2$/V·sec, and the threshold voltage Vth was 5.0 V.

One substrate of a liquid-crystal electro-optical device was fabricated by the method described above. The arrangement of the electrodes and other components of this liquid-crystal electro-optical device is shown in FIG. 7. The n-channel TFT 76 and the p-channel TFT 77 were formed at the intersection of a first signal line 40 and a second signal line 41. Complementary pairs of TFTs of such a construction were arranged in rows and columns. The n-channel TFT 76 was connected to the second signal line 41 via the lead 71 at the input terminal of the drain 63. The gate electrode portion 56 was connected with the first signal line 40 which forms multilayered wiring. The output terminal of the source 62 is connected to the pixel electrodes 75 via contacts 72.

On the other hand, with respect to the p-channel TFT 77, the input terminal of the drain 60 was connected with the second signal line 41 via the lead 73. The gate electrode portion 58 was connected with the signal line 40. The output terminal of the source 59 is connected with the pixel electrodes 75 via the contacts 72, in the same way as the n-channel TFT. This structure is repeated horizontally and vertically to complete the present example.

As a second substrate, silicon oxide was sputtered on a blue sheet glass to a thickness of 2000 Å. Again, an ITO film was formed on this substrate by sputtering at a temperature between room temperature and 150° C. The film was annealed at 200–400° C. in an ambient of oxygen or atmosphere. A color filter was formed on this substrate, thus completing the second substrate.

Figure 16:
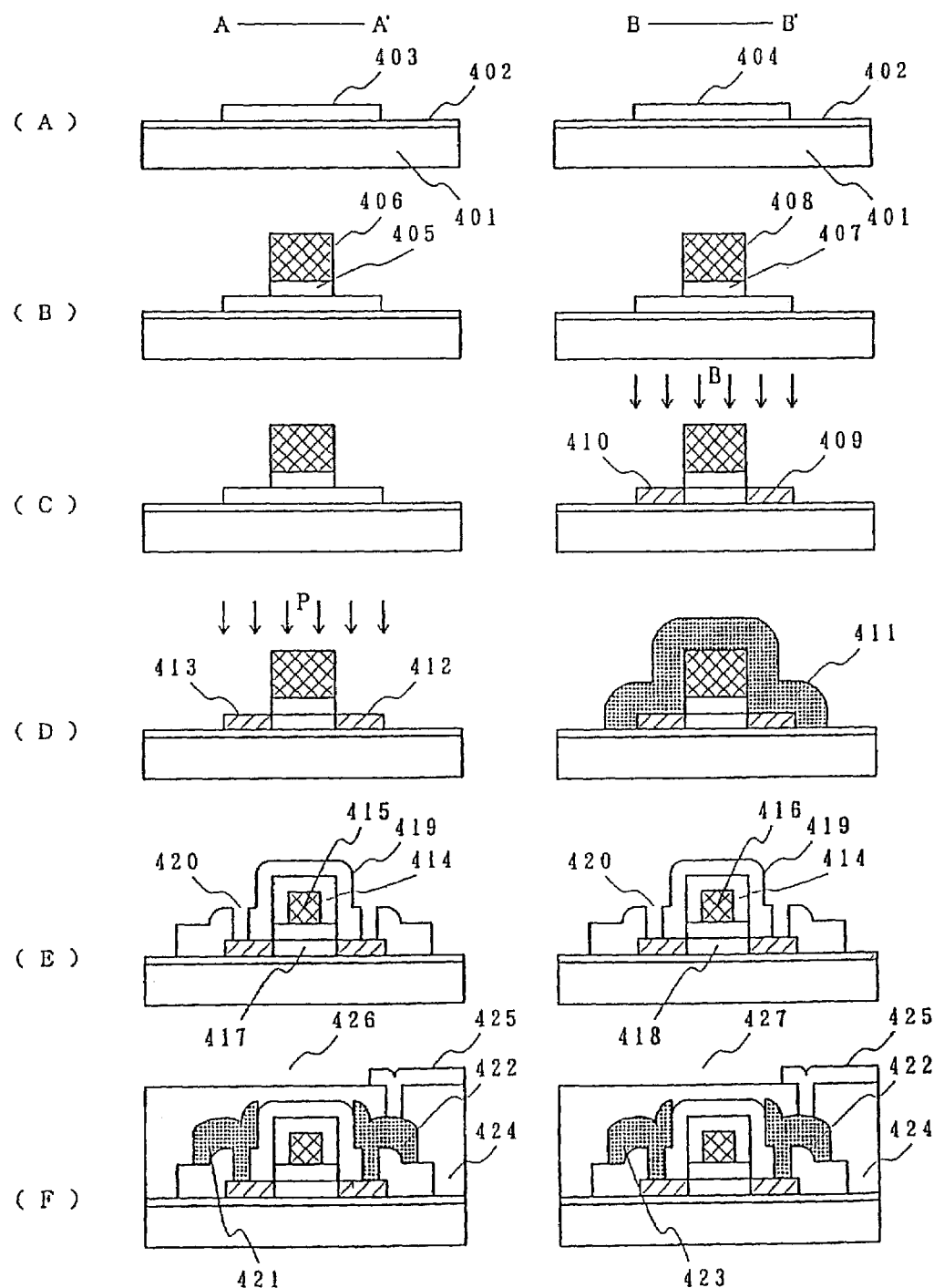
FIG. 16, (A)-(F), are cross-sectional views of a portion of the active-matrix liquid-crystal electro-optical device according to Example 1.

A mixture containing 6 parts of acrylic resin that hardens on illumination of ultraviolet radiation and 4 parts of a nematic liquid crystal was sandwiched between the first and second substrates. The periphery of the substrates was fixed with epoxy resin. Since the leads on the substrates were spaced only 46 $\mu$m from each other, they were connected by the COG method. In the present example, gold bumps formed on an IC chip were connected by means of epoxy silver-palladium resin. The spaces between the IC chip and the substrates were buried with epoxy-modified acrylic resin, whereby all of them were bonded together hermetically. Then, polarizing plates were stuck to the outside. As a result, a transmission-type liquid-crystal electro-optical device was obtained. Also, a transmission-type liquid-crystal electro-optical device may also be fabricated as illustrated in FIG. 16, (A)-(F), in the same. way as in Example 1.

EXAMPLE 2

In the present example, variations of the characteristics of semi-amorphous silicon TFTs due to different widths of the offset regions are described. In the present example, the semi-amorphous silicon TFTs have aluminum gates. The surroundings of the aluminum gates are oxidized by anodization. Thus, offset regions are formed. A method of fabricating the TFTs is next described in detail.

A multilayered film consisting of a silicon nitride film and a silicon oxide film was formed on a glass substrate. An amorphous silicon film was formed to a thickness of 150 nm by plasma-assisted CVD. The silicon film was patterned to form TFT channels having a width of 80 $\mu$m. The laminate was heated at 600° C. for 60 hours within an ambient of nitrogen. As a result, the silicon was made semi-amorphous.

Then, a target of silicon oxide was sputtered in an ambient of oxygen to form a silicon oxide film which would become a gate oxide film. The thickness was 115 nm. An aluminum coating was formed by electron beam evaporation. The aluminum coating and the underlying silicon oxide film were etched by a well-known photolithographic technique to form gate electrodes. In the etching process, reactive-ion etching (RIE) was used. The channel length of the gate electrodes formed in this way was 8 $\mu$m.

Then, the gate electrodes and their interconnects were anodized. For this purpose, tartaric acid was diluted with ethylene glycol to a concentration of 3% and put in a container. Then, 5% by weight of aqueous ammonia was added to the liquid so that the pH was adjusted to 7.0±0.2. The whole laminate was immersed in the solution while using a platinum electrode as a cathode at a temperature of 25±2° C. The aluminum interconnects were connected with the positive terminal of a DC power supply. In this way, the laminate was anodized.

In the anodization step, a constant current of 0.2 to 1.0 mA/cm$^2$ was first passed. After an appropriate voltage of 100 to 250 V was reached, the anodization was made to progress while the maintaining the voltage constant. When the current dropped to 0.005 mA/cm$^2$, the energization is stopped. Then, the laminate was taken out. Our experiment revealed that the initial constant current affected only the oxidation film formation time and hardly affected the thickness of the finally formed oxide film. A parameter which greatly affects the thickness of the oxide film is the maximum attainable voltage. Where this maximum voltage was 100 V, 150 V, 200 V, and 250 V, the thickness of the obtained oxide film was 70 nm, 140 nm, 230 nm, and 320 nm, respectively. Also, our experiment has shown that a film of aluminum oxide 1.5 times as thick as the oxidized aluminum is obtained. Furthermore, the thickness of the obtained oxide film was quite uniform over the whole length.

Then, source and drain regions were formed by laser doping. In this laser doping process, a KrF laser that is one kind of excimer laser was used. The oscillation frequency was 248 nm. The sample was placed in a hermetic container. A low-pressure ambient of 95 Pa was created. Diborane ($B_2H_6$) or phosphine ($PH_3$) was introduced as a doping gas into the container. Fifty shots of laser pulses were illuminated. The energy of each shot of laser pulse was 350 mJ.

Where a p-channel TFT was fabricated, diborane diluted with hydrogen was used as the doping gas. The flow rate of the diborane was 100 sccm. The flow rate of the hydrogen was 20 sccm. Where an n-channel TFT was manufactured, phosphine was employed. The flow rate of the phosphine was 100 sccm.

Then, in order to promote the activation of the channel region, the laminate was annealed at 250° C. for 30 minutes within hydrogen. An interlayer insulating film, source and drain electrodes, and their interconnects were formed by a well-known method, thus completing TFTs.

Figure 9:
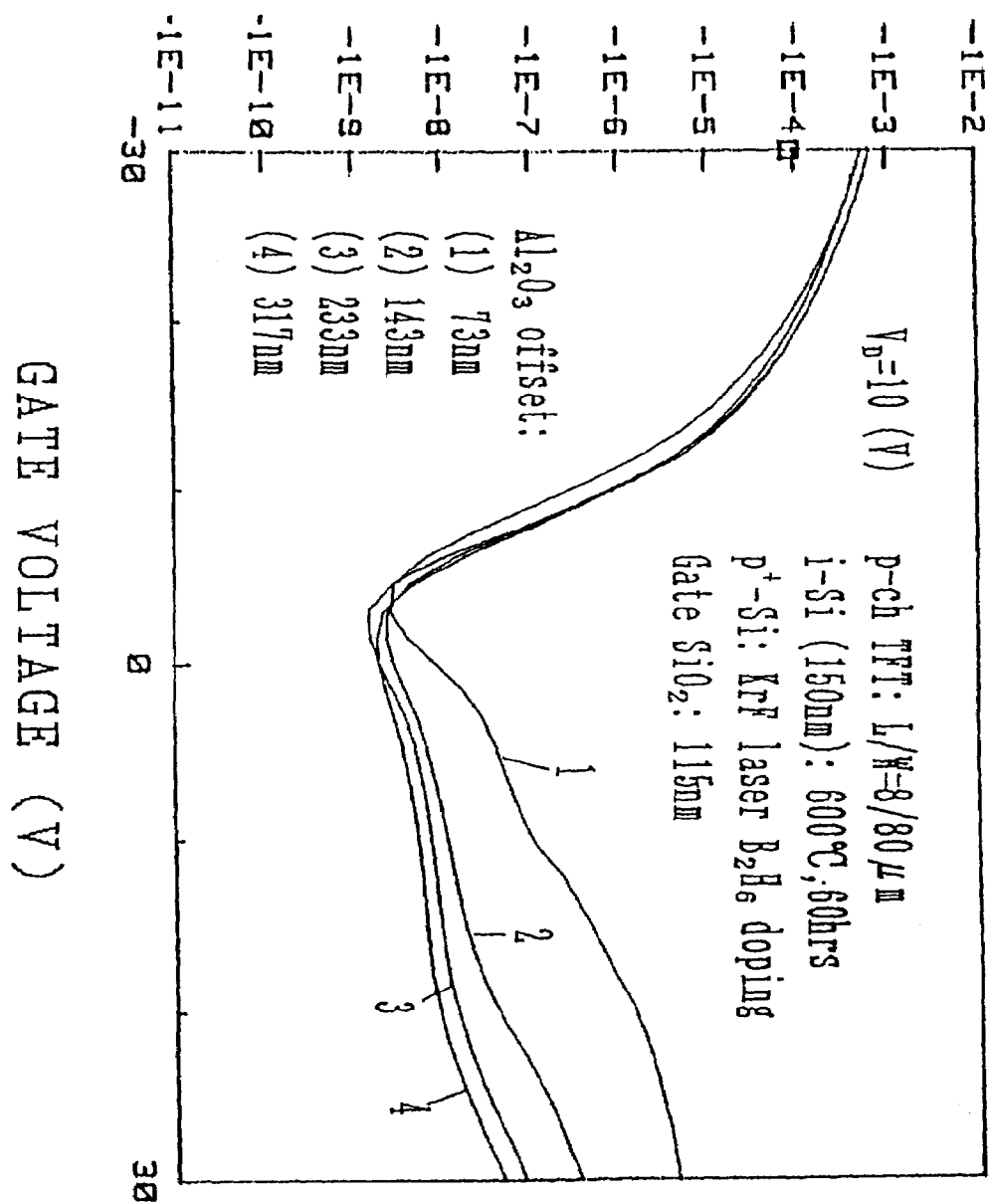
FIG. 9 is a graph showing the current-voltage characteristic of the p-channel TFT of Example 2 of the invention.
Figure 10:
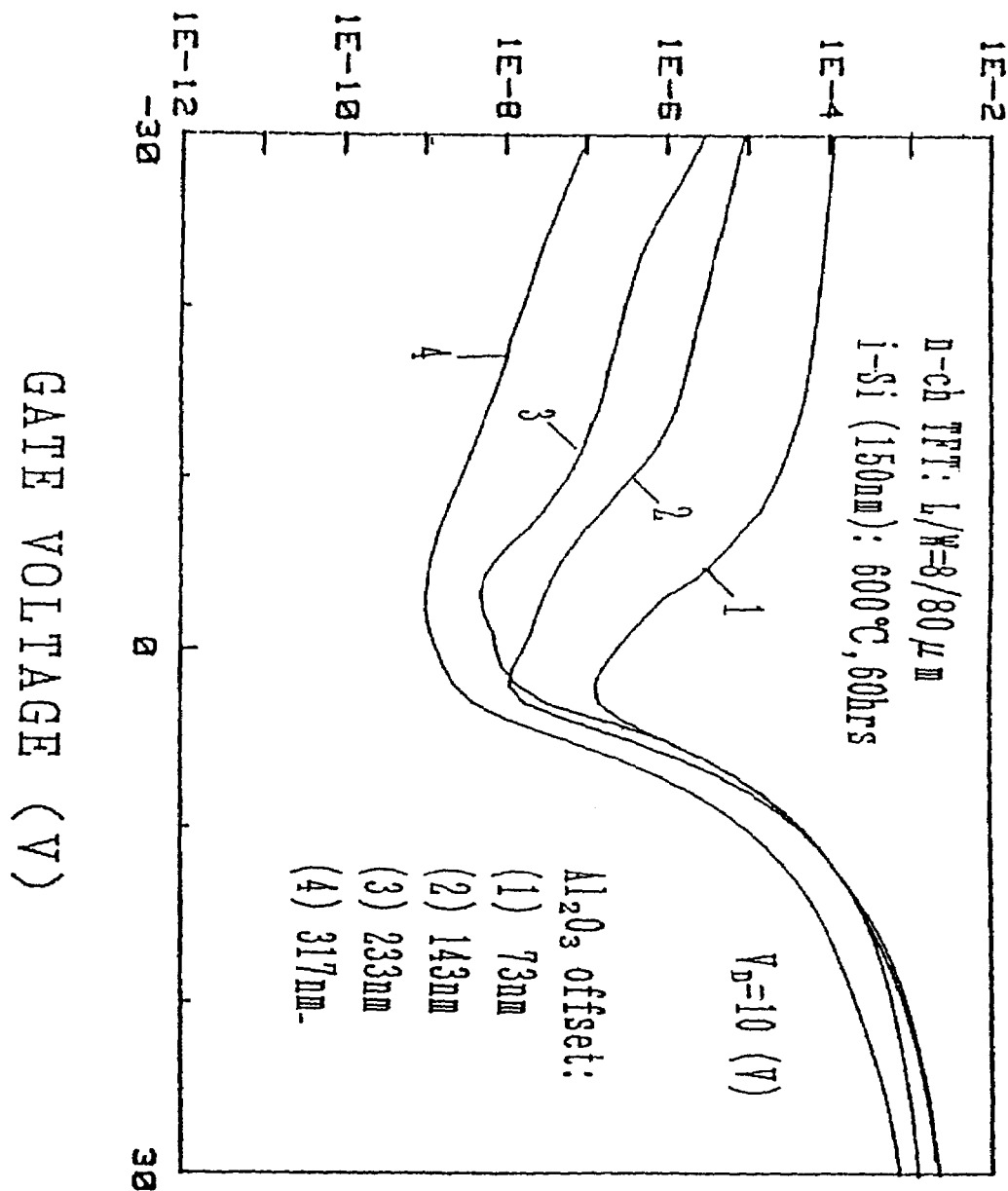
FIG. 10 is a graph showing the current-voltage characteristic of the n-channel TFT of Example 2 of the invention.

Examples of the characteristics of the TFTs fabricated in this way are shown in FIGS. 9 and 10. FIG. 9 shows the characteristics of the p-channel TFT. FIG. 10 shows the characteristics of the n-channel TFT. Since it is difficult to directly measure the sizes of the offset regions, the advantages of the invention are described in terms of the thickness of the oxide film around the gate electrode. We consider that this thickness sufficiently reflects the sizes of the offset regions.

Figure 11:
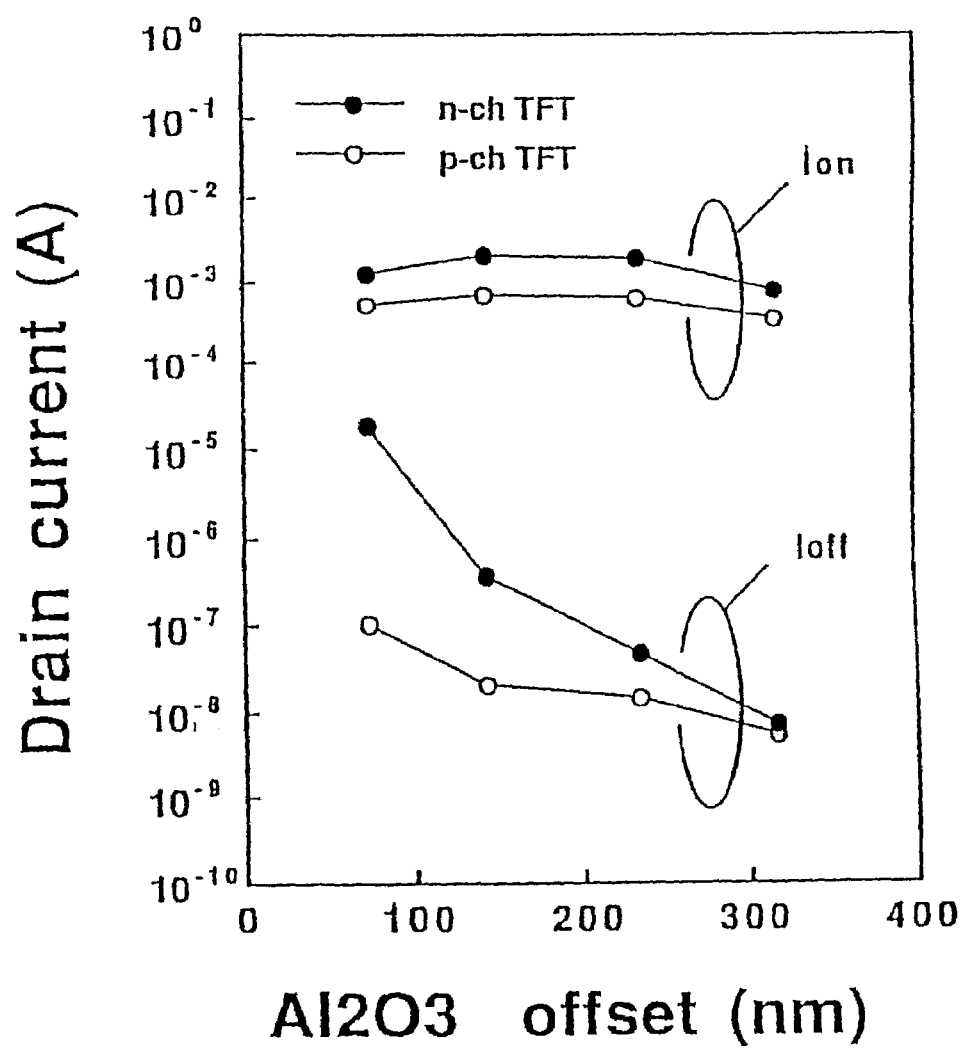
FIG. 11 is a graph illustrating the dependence of the drain current of Example 2 on the thickness of the anodized film.

As can be seen from FIGS. 9 and 10, the leakage current in the reverse direction and OFF current are reduced with increasing the thickness of the oxide film, i.e., with increasing the widths of the offset regions. We have found that this effect is more conspicuous for the n-channel TFT. In particular, for the n-channel TFT, the current, or OFF current, flowing when the gate voltage is zero decreased as the offset regions were formed and dropped to a practical level. For the p-channel TFT, the OFF current did not decrease, but the leakage current in the reverse direction decreased greatly. The reduction in the OFF current caused by the formation of the offset regions is illustrated in FIG. 11, where $I_{OFF}$ is the OFF current, and $I_{ON}$ is the ON current.

Figure 12:
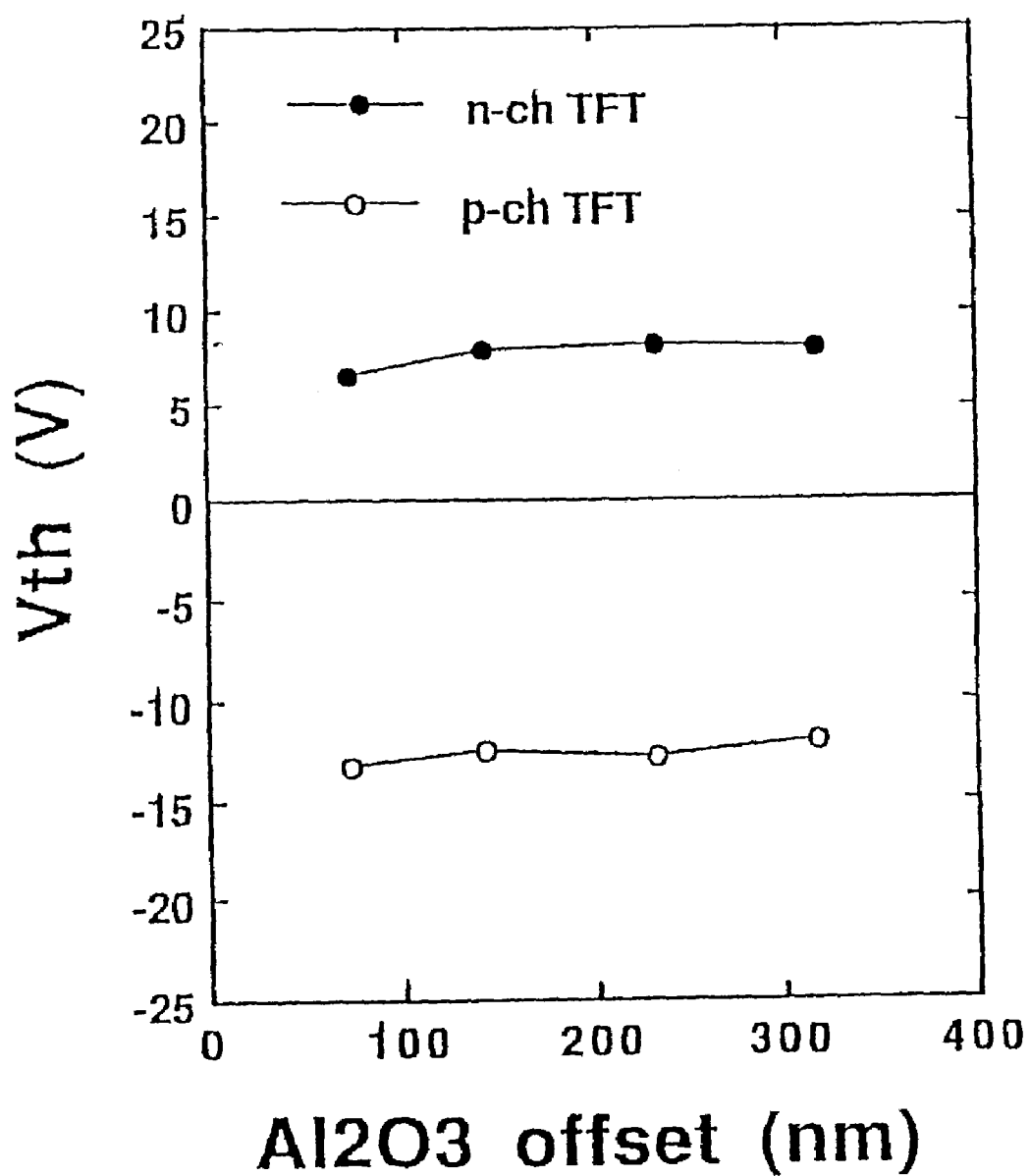
FIG. 12 is a graph illustrating the dependence of the threshold voltage of Example 2 on the thickness of the anodized film.
Figure 13:
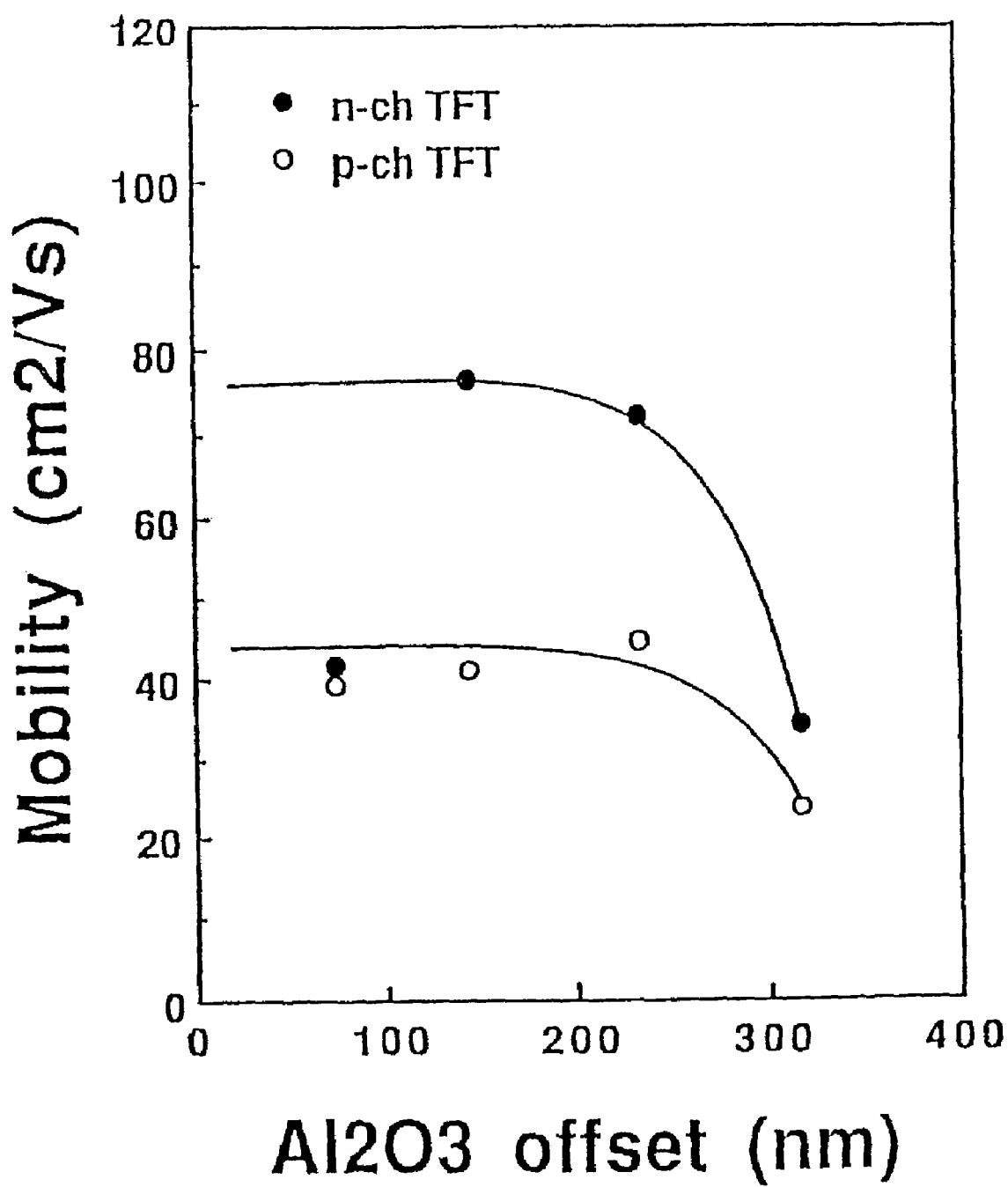
FIG. 13 is a graph illustrating the dependence of the field mobility of Example 2 on the thickness of the anodized film.

The formation of the offset regions did not vary the threshold voltages Vth of the TFTs. This is illustrated in FIG. 12. However, a different experiment has shown that where the offset regions are abnormally large, deteriorations in the characteristics are observed because the formed channel is discontinuous. For example, as shown in FIG. 13, if the width of each offset region exceeds 300 nm, then the field mobility decreases rapidly for both n-channel and p-channel TFTs. Considering these results, it can be seen that the appropriate range of the width of each offset region is from 200 to 400 nm.

EXAMPLE 3

In TFTs fabricated in accordance with the present invention, the width of each offset region affects not only the OFF current but also the voltage-resistance capability between the source and drain and the operating speed. Therefore, desired TFTs can be fabricated by optimizing a parameter such as the thickness of the anodized film. However, it is generally impossible to adjust such parameters of individual TFTs formed on one substrate separately. For example, an actual circuit is required that TFTs operating at a low speed and withstanding high voltages and TFTs operating at a high speed and withstanding low voltages be formed on the same substrate. In accordance with the fundamental principle of the present invention, with increasing the width of each offset region, the OFF current decreases and the resistance to voltage improves but the operating speed drops.

Figure 14:
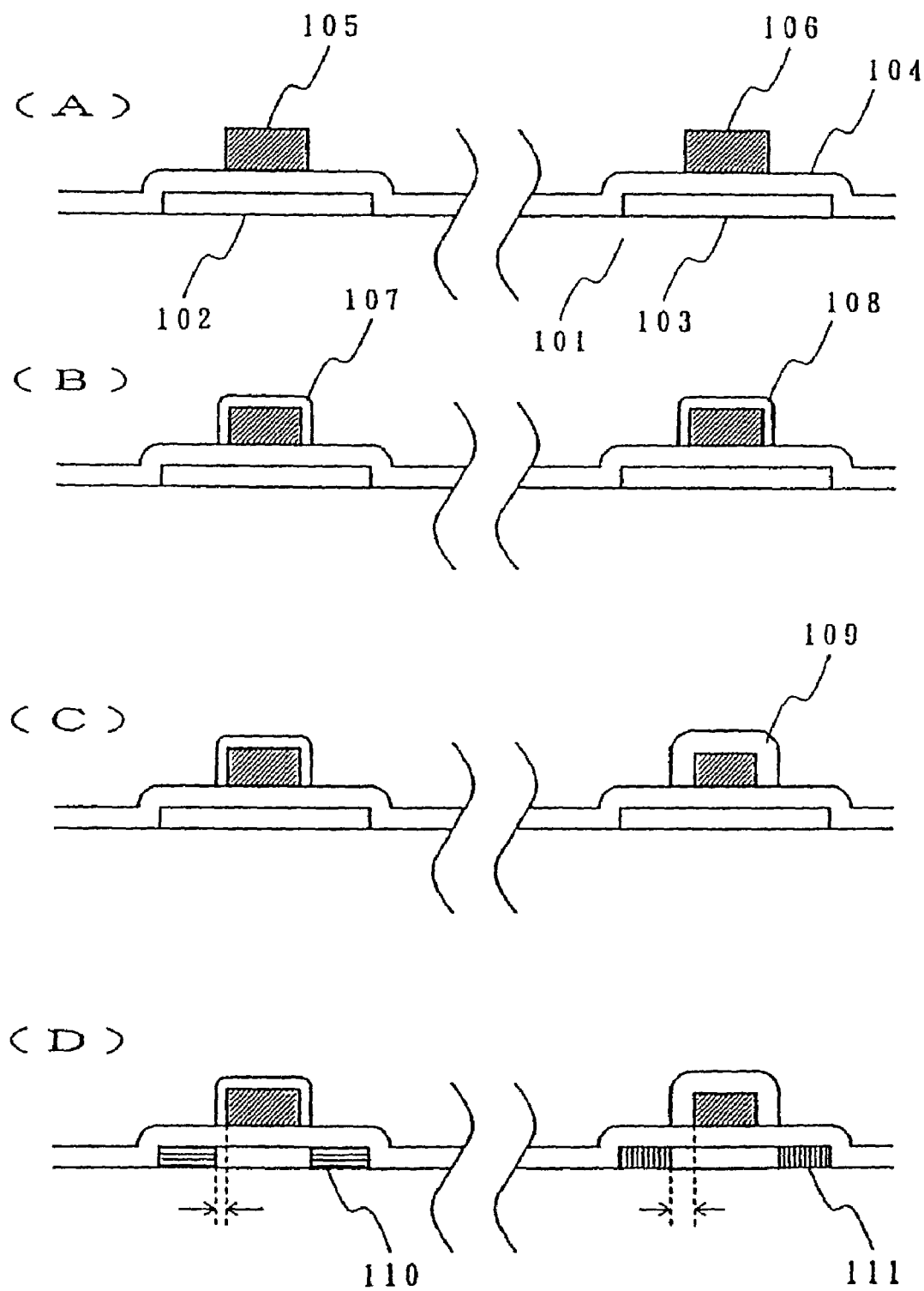
FIG. 14, (A)-(D), are cross-sectional views of a portion of a thin-film transistor according to Example 2, illustrating the sequence in which the device is fabricated.

This example solves this problem and is next described by referring to the cross sections of FIG. 14, (A)-(D) and to the plan views of FIG. 15, (A)-(C). This example pertains to manufacture of a circuit used in an image display method using both a p-channel TFT and an n-channel TFT to activate one pixel, as described in Japanese Patent application Ser. No. 296331/1991. This n-channel TFT is required to operate at a high speed but suffices to withstand only low voltages. On the other hand, the p-channel TFT is not required to operate at a very high speed but its OFF current must be low. In some cases, it is necessary that the p-channel TFT withstand high voltages. Accordingly, the requirement is that the anodized film of the n-channel TFT be thin (20 to 100 nm) and that the anodized film of the p-channel TFT be thick (250 to 400 nm). Steps for manufacturing the present example are described below.

As shown in FIGS. 14(A) and 15(A), a substrate 101 was made of Corning 7059 glass. A substantially intrinsic amorphous or polycrystalline semiconductor film, for example an amorphous silicon film, was formed to a thickness of 50 nm. This film was patterned into islands to form n-channel TFT regions 102 and p-channel TFT regions 103. The laminate was annealed at 600° C. for 60 hours in an ambient of nitrogen to recrystallize the TFT regions.

Silicon oxide was deposited as a 115-nm-thick gate-insulating film 104 by ECR PCVD. If movable ions such as sodium ions exist in the silicon oxide film formed in this way, then it is desired to remove the adverse effect of the movable ions by introducing an element such as phosphorus into the film to fix the movable ions. Such an element can be introduced by ion doping which is also known as plasma doping.

The present inventors have discovered that phosphorus introduced into silicon oxide by ion doping functions effectively as a getter for sodium. During the ion doping process, phosphorus ions were accelerated at 2 to 30 keV, e.g. 10 keV. The pressure around a target to be doped was $2 \times 10^{-5}$ to $5 \times 10^{-4}$ torr, e.g., $1 \times 10^{-4}$ torr. In this example, the target was a film of silicon oxide. The concentration of the phosphorus was $5 \times 10^{13}$ to $1 \times 10^{15}$ ions/cm$^2$, e.g., $2 \times 10^{14}$ ions/cm$^2$. In this way, the dose of the phosphorus was less than the dose of dopants introduced when doped regions of ordinary MOS transistors are formed.

After introducing the phosphorus in this way, the laminate was annealed at 600° C. for 24 hours within an ambient of nitrogen to remove defects in the silicon oxide produced by the ion doping. The introduction of the phosphorus into the silicon oxide film greatly suppressed deteriorations in the characteristics due to the movable ions. Hence, the reliability could be improved. For example, a MOS capacitor having a silicon oxide film formed by the above-described method was subjected to bias/temperature processing of ±20 V at 150° C. for 1 hour. The threshold voltage varied by only 1 V. Where the introduction of the phosphorus was not effected, the threshold voltage changed by as much as over 10 V.

After forming the silicon oxide film in this manner, a film of tantalum which is a metal withstanding high temperatures was formed to a thickness of 500 nm. This tantalum film was patterned to form the gate electrode portion 105 of the n-channel TFT and the gate electrode portion 106 of the p-channel TFT. Instead of tantalum, low-resistivity, i.e., sufficiently doped, polysilicon may be used. At this time, the length and the width of the channel were both 8 μm. The gate electrodes and their interconnects were all connected electrically with a common interconnect 150, as shown in FIG. 15(A).

An electrical current was passed through the gate electrodes and their interconnects 105 and 106 to form aluminum oxide films 107 and 108 on the upper surfaces and on the side surfaces of the gate electrodes and their interconnects 105 and 106 by anodization (anodic oxidation). This anodization was carried out similarly to Example 2 except that the maximum voltage was 50 V. Accordingly, the thickness of the anodized film fabricated in this step was about 60 nm (FIG. 14(B)).

Referring to FIG. 15(B), the gate electrodes and their interconnects 105 were cut away from the common interconnect 150 at 151 by laser etching. Under this condition, anodization (anodic oxidation) was again initiated by passing current through the interconnect 150 to anodic oxidize surface portions of the gate electrodes connected to the interconnect 150 after the cut away. The conditions were similar to the previous conditions except that the maximum voltage was increased to 250 V. Since no current flowed through the interconnect 105, no change was observed. However, a tantalum oxide film 109 having a thickness of about 300 nm was formed around the gate interconnects 106, because an electrical current flowed through the interconnects 106 (FIG. 14(C)).

Subsequently, dopant ions were introduced into the islands of semiconductor 102 and 103 by ion doping. Phosphorus (P) and boron (B) were implanted into the semiconductor regions 102 and 103, respectively, by a well-known CMOS fabrication technique. The energy of the ion doping was 80 keV. The present inventors and others know that where dopant ions are implanted by passing through the gate-insulating film 100 to 300 nm thick, if the energy exceeds 100 keV, then the semiconductor crystal is severely destroyed by the implanted ion energy. High temperatures above 600° C. have been needed to activate such regions in which the dopants are diffused. It has been very difficult to obtain a high production yield in this process. However, where the energy of the implanted ions was 100 keV or less, the resistance was made sufficiently low at temperatures below 600° C., e.g., 450–500° C.

After the ion doping step, the laminate was annealed at 500° C. for 30 hours within an ambient of nitrogen, so that the sheet resistances of the source and drain regions could be rendered sufficiently low. The condition up to this point is shown in FIG. 14(D). As can be seen from the figure, the width of the offset region of the left TFT is small, while the width of the offset region of the right TFT is large. Thereafter, the metal interconnects 106 and 150 were cut at required locations such as 152 and 153 by a well-known technique. Then, an interlayer insulating film was formed. Contact holes were formed. Conductive interconnects such as 112 and 113 were connected to the electrodes, thus completing a circuit as shown in FIG. 15(C).

In the circuit fabricated in this way, the width of the offset region of the n-channel TFT was small. The OFF current was slightly large, but this TFT was excellent in speed of operation. On the other hand, it was difficult to operate the p-channel TFT at a high speed, but the OFF current was small. Also, the p-channel TFT was excellent in the ability to hold the electric charge stored in the pixel capacitor connected with one of source and drain regions of the p-channel TFT. The pixel capacitor comprises a pair of electrodes (indium tin oxide) and an electro-optical modulating layer provided between the electrodes and comprising a liquid crystal.

There exist other situations in which TFTs having different functions must be packed on one substrate. For example, in a liquid-crystal display driver, high-speed TFTs are required for the logic circuits including shift registers, whereas TFTs withstanding high voltages are required for the output circuit. The method of this example is effective in fabricating TFTs which must satisfy conflicting requirements in this way.

EXAMPLE 4

In the TFTs fabricated in accordance with the present invention, the width of each offset region affects not only the OFF current but also the voltage-withstanding capability between the source and drain and the operating speed. Therefore, TFTs meeting the objective can be built by optimizing a parameter such as the thickness of the anodized film. However, it is generally impossible to adjust such parameters of individual TFTs formed on one substrate separately. For example, an actual circuit is required that TFTs operating at a low speed and withstanding high voltages and TFTs operating at a high speed and withstanding low voltages be formed on the same substrate. In accordance with the fundamental principle of the present invention, with increasing the width of each offset region, the OFF current decreases and the resistance to voltage improves but the operating speed drops.

This example solves this problem and is next described by referring to the cross sections of FIG. 14, (A)-(D), and to the plan views of FIG. 15, (A)-(C). This example pertains to manufacture of a circuit used in an image display method using both a p-channel TFT and an n-channel TFT to activate one pixel, as described in Japanese Patent application Ser. No. 296331/1991. This n-channel TFT is required to operate at a high speed but suffices to withstand only low voltages. On the other hand, the p-channel TFT is not required to operate at a very high speed but its OFF current must be low. In some cases, it is necessary that the p-channel TFT withstand high voltages. Accordingly, the requirement is that the anodized film of the n-channel TFT be thin (20 to 100 nm) and that the anodized film of the p-channel TFT be thick (250 to 400 nm). Steps for manufacturing the present example are described below.

As shown in FIGS. 14(A) and 15(A), a substrate 101 was made of Corning 7059 glass. A substantially intrinsic amorphous or polycrystalline semiconductor film, for example an amorphous silicon film, was formed to a thickness of 50 nm. This film was patterned into islands to form n-channel TFT regions 102 and p-channel TFT regions 103. The laminate was annealed at 600° C. for 60 hours in an ambient of nitrogen to recrystallize the TFT regions.

Silicon oxide was deposited as a 115-nm-thick gate-insulating film 104 by ECR PCVD. A film of tantalum which is a metal withstanding high temperatures was formed to a thickness of 500 nm. This tantalum film was patterned to form the gate electrode portion 105 of the n-channel TFT and the gate electrode portion 106 of the p-channel TFT. Instead of tantalum, low-resistivity, i.e., sufficiently doped, poly-silicon may be used. At this time, the length and the width of the channel were both 8 $\mu$m. The gate electrodes and their interconnects were all connected electrically with a common interconnect 150, as shown in FIG. 15(A).

An electrical current was passed through the gate electrodes and their interconnects 105 and 106 to form aluminum oxide films 107 and 108 on the upper surfaces and on the side surfaces of the gate electrodes and their interconnects 105 and 106 by anodization. This anodization was carried out similarly to Example 2 except that the maximum voltage was 50 V. Accordingly, the thickness of the anodized film fabricated in this step was about 60 nm (FIG. 14(B)).

Referring to FIG. 15(B), the gate electrodes and their interconnects 105 were cut away from the common interconnect 150 at 151 by laser etching. Under this condition, anodization was again initiated. The conditions were similar to the previous conditions except that the maximum voltage was increased to 250 V. Since no current flowed through the interconnect 150, no change was observed. However, a tantalum oxide film 109 having a thickness of about 300 nm was formed around the gate interconnects 106, because an electrical current flowed through the interconnects 106 (FIG. 14(C)).

Subsequently, dopant ions were introduced into the islands of semiconductor 102 and 103 by ion doping. Phosphorus (P) and boron (B) were implanted into the semiconductor regions 102 and 103, respectively, by a well-known CMOS fabrication technique. The energy of the ion doping was 80 keV. We know that if the energy is in excess of 100 keV, then high temperatures above 600° C. are needed to activate such regions in which the dopants are diffused. It has been very difficult to obtain a high production yield in this process. However, where the energy of the implanted ions was less than 100 keV, the resistance was made sufficiently low at temperatures below 600° C., e.g., 450–500° C.

After the ion doping step, the laminate was annealed at 500° C. for 30 hours within an ambient of nitrogen, so that the sheet resistances of the source and drain regions could be rendered sufficiently low. The condition up to this point is shown in FIG. 14(D). As can be seen from the figure, the width of the offset region of the left TFT is small, while the width of the offset region of the right TFT is large. Thereafter, the metal interconnects 106 and 150 were cut at required locations such as 152 and 153 by a well-known technique. Then, an interlayer insulating film was formed. Contact holes were formed. Conductive interconnects such as 112 and 113 were connected to the electrodes, thus completing a circuit as shown in FIG. 15(C).

In the circuit fabricated in this way, the width of the offset region of the n-channel TFT was small. The OFF current was relatively large, but this TFT was excellent in speed of operation. On the other hand, it was difficult to operate the. p-channel TFT at a high speed, but the OFF current was small. Also, the p-channel TFT was excellent in the ability to hold the electric charge stored in the pixel capacitor.

EXAMPLE 5

Figure 18:
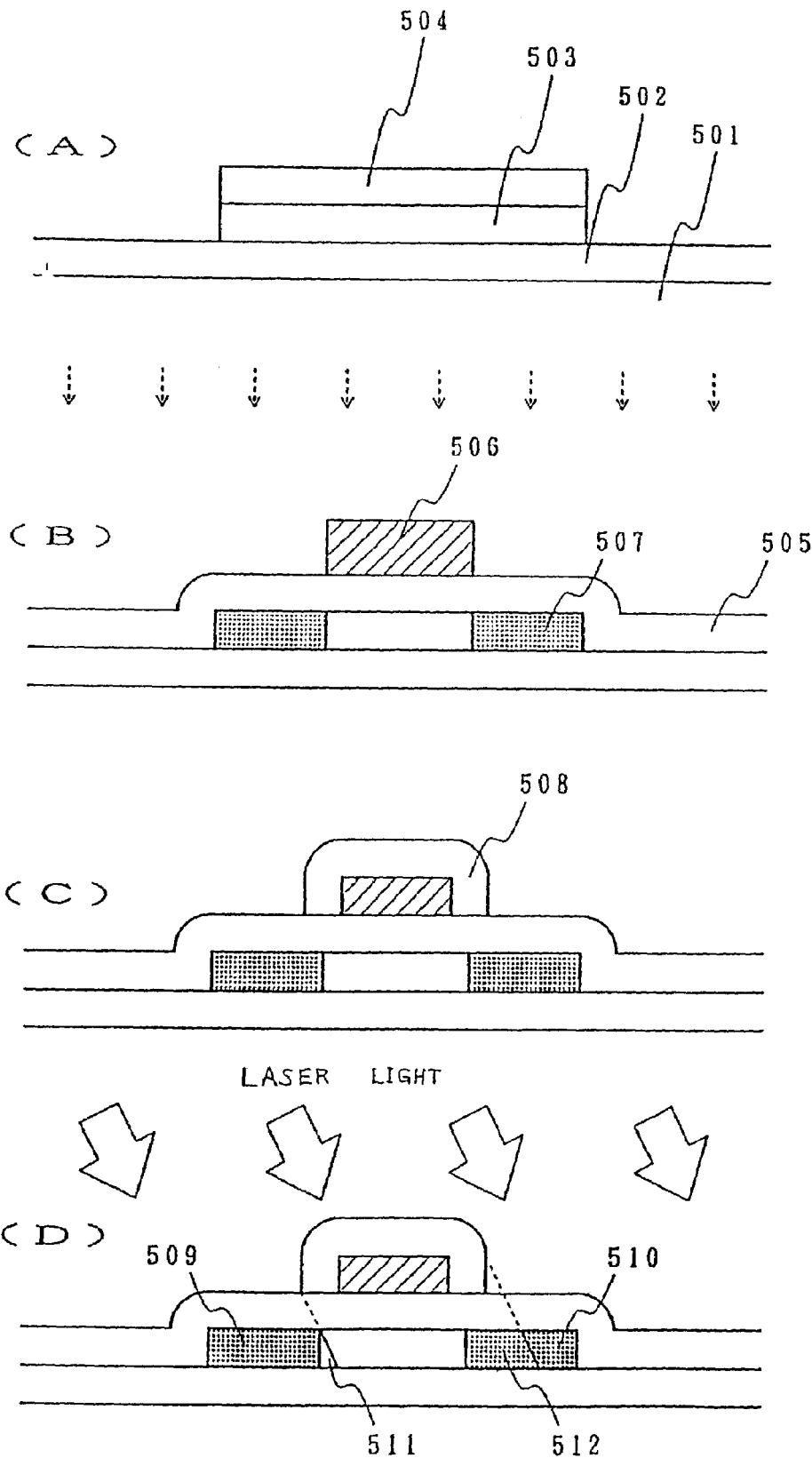
FIG. 18, (A)-(D), are cross-sectional views of a thin-film transistor according to Example 5 of the invention, illustrating the sequence in which the device is fabricated.

FIG. 18, (A)-(D), show cross-sections of the present example. A substrate 501 was fabricated from Corning 7059 glass. Then, an underlying silicon oxide film 502 was formed to a thickness of 100 nm by sputtering. Also, an amorphous silicon film 503 was formed to a thickness of 50 nm by plasma-assisted CVD. To protect the amorphous silicon film, a silicon oxide film 504 was formed to a thickness of 20 nm also by sputtering. The laminate was annealed at 600° C. for 72 hours within an ambient of nitrogen to recrystallize the films. The recrystallized films were patterned by a photolithographic method and reactive ion etching (RIE) to form semiconductor island regions as shown in FIG. 18(A). Then, the protective silicon oxide film 504 was removed by wet etching, using buffered hydrofluoric acid that was a solution of a mixture of hydrogen fluoride and ammonium fluoride. An example of this solution consisted of 1 part by weight of high-purity hydrofluoric acid (50% by weight) used for semiconductor fabrication and 10 parts by weight of a solution of ammonium fluoride (40% by weight) used for semiconductor fabrication. This buffered hydrofluoric acid etched silicon oxide at a rate of 70 nm/min, etched silicon at a rate of 60 nm/min, and etched aluminum at a rate of 15 nm/min.

A gate oxide film 505 having a thickness of 115 nm was formed by sputtering in an ambient of oxygen while using silicon oxide as a target. Under this condition, phosphorus ions were implanted into the gate oxide film 505 by a plasma doping method to getter the movable ions, such as sodium, existing inside the gate oxide film. Where the concentration of sodium is so low that the operation of the device is not impeded by the movable ions, it is not necessary to conduct the ion implantation. In the present example, the plasma-accelerating voltage was 10 keV. The dose was $2 \times 10^{14}$ ions/cm$^2$. The laminate was annealed at 600° C. for 24 hours. As a result, the damage to the oxide film and to the silicon film by the bombardment of the plasma doping was recovered.

Then, an aluminum film was formed by sputtering and patterned with a mixed acid, i.e., a solution of phosphoric acid to which 5% nitric acid was added, to form gate electrodes and their interconnects 506. The etching rate was 225 nm/min. when the etching temperature was 40° C. In this way, the contours of the TFTs were adjusted. At this time, the length of the channel was 8 $\mu$m, and the width was 20 $\mu$m.

N-type doped regions 507, or source and drain, were formed in the semiconductor region by ion implantation. In this step, phosphorus ions were implanted as dopant ions. The energy of the ions was 80 keV, and the dose was $5 \times 10^{15}$ ions/cm$^2$. As shown, the dopant ions were implanted through the oxide film. The advantage of the use of this implantation is that during subsequent recrystallization utilizing laser annealing, the smoothness of the surfaces of the doped regions is maintained. Where this implantation is not employed, numerous crystal nuclei form on the surfaces of the doped regions during recrystallization, thus giving rise to unevenness on the surfaces. In this way, the structure shown in FIG. 18(B) was derived. Of course, the crystallinity of doped portions is severely deteriorated by this ion implantation. These portions are substantially in amorphous state or in polycrystalline state close to the amorphous state.

An electrical current was passed through the interconnects 506. A film 508 of aluminum oxide was formed on the top surfaces and on the side surfaces of the gate electrodes and their interconnects by anodization. For this anodization, ethylene glycol solution of 3% tartaric acid was neutralized with 5% ammonia to control the pH of the solution to 7.0±0.2. Platinum was immersed as a cathode in the solution. Then, the TFTs were immersed in the solution together with the substrate. The interconnects 506 were connected with the anode of the power supply. The temperature was kept at 25±2° C.

Under this condition, an electrical current of 0.5 mA/cm$^2$ was first passed. When the voltage reached 200 V, the device was energized while maintaining the voltage constant. When the current reached 0.005 mA/cm$^2$, the current was cut off, thus bringing the anodization to an end. The thickness of the anodized film (anodic oxidation coating of the gate electrode) obtained in this way was about 250 nm. This is illustrated in FIG. 18(C).

Subsequently, the laminate was laser annealed, using a KrF excimer laser. For instance, 10 shots of laser pulses having a power density of 350 mJ/cm$^2$ were illuminated. We have confirmed that the crystallinity of the amorphous silicon can be recovered to such an extent that the amorphous silicon can withstand the operation of the TFTs by at least one shot of laser radiation. To sufficiently reduce the possibility of occurrence of defects due to fluctuations of the power of the laser, a sufficient number of shots of laser pulses are desired. However, too many shots of laser radiation will deteriorate the productivity. We have found that 10 shots or so which are used in the present example are most desirable.

The laser anneal was conducted within the atmosphere to increase the productivity. No problems took place, since the silicon oxide film had been already formed on the doped regions. Where the laser anneal was carried out while exposing the doped regions, oxygen entered the doped regions from the atmosphere simultaneously with the crystallization, thus deteriorating the crystallinity. Hence, TFTs having satisfactory characteristics could not be obtained. Therefore, laminates in which doped regions were exposed were required to be laser annealed in vacuum.

In the present example, as shown in FIG. 18(D), a laser radiation was made to obliquely enter the laminate. As an example, the laser radiation was at an angle of 10° to the normal to the substrate. The angle is determined according to the design specifications of the manufactured devices. Of the doped regions, the regions crystallized by the laser can be made asymmetrical. That is, regions 509 and 510 are doped regions which are sufficiently crystallized. A region 511 is not a doped region but crystallized by the laser radiation. A region 512 is a doped region but is not crystallized. For example, the doped region on the right side of FIG. 18(D) may be used as the drain in which hot electrons tend to occur.

In this way, the shapes of the devices were adjusted. Then, silicon oxide was sputtered to form an interlayer insulator in the conventional manner. Holes for electrodes were formed by a well-known photolithographical technique to expose the surface of the semiconductor region or the surfaces of the gate electrodes and their interconnects. Finally, a metal coating was selectively formed. In this way, a device was completed.

EXAMPLE 6

In the TFTs fabricated in accordance with the present invention, the width of the amorphous semiconductor region and the width of each offset region affect not only the OFF current but also the voltage-withstanding capability between the source and drain and the operating speed. Therefore, TFTs meeting the objective can be built by optimizing a parameter such as the thickness of the anodized film or the energy of implanted ions. However, it is generally impossible to adjust such parameters of individual TFTs formed on one substrate separately. For example, an actual circuit is required that TFTs operating at a low speed and withstanding high voltages and TFTs operating at a high speed and withstanding low voltages be formed on the same substrate. In accordance with the fundamental principle of the present invention, with increasing the width of each offset region or of the doped amorphous semiconductor region, the OFF current decreases and the resistance to voltage improves but the operating speed drops.

Figure 19:
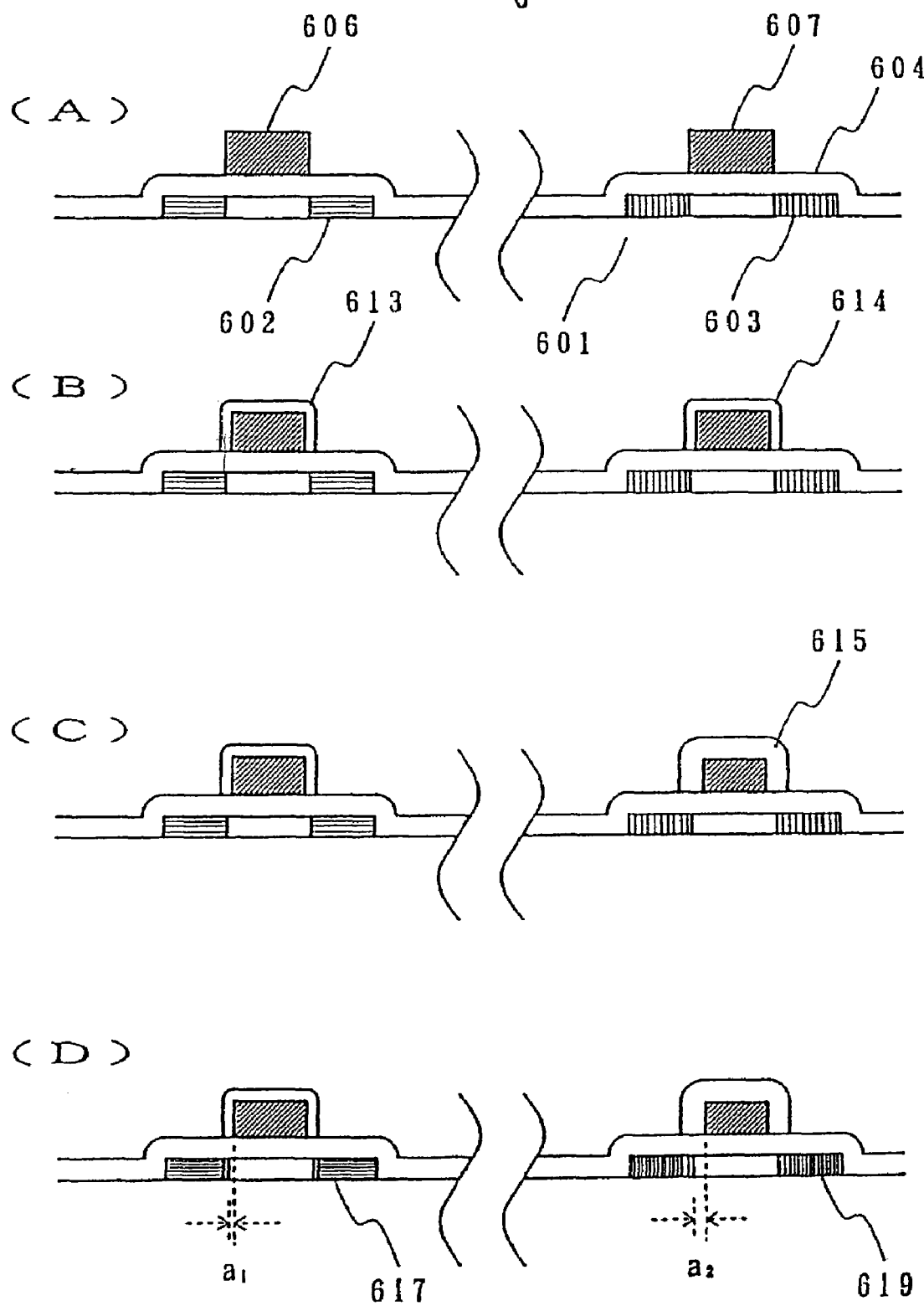
FIG. 19, (A)-(D), are cross-sectional views of a thin-film transistor according to Example 6 of the invention, illustrating the sequence in which the device is fabricated.

This example solves this problem and is next described by referring to the plan views of FIG. 22, (A)-(C), and to the cross sections of FIG. 19, (A)-(D). This example pertains to manufacture of a circuit used in an image display method using both a p-channel TFT and an n-channel TFT to activate one pixel, as described in Japanese Patent application Ser. No. 296331/1991. This n-channel TFT is required to operate at a high speed but suffices to withstand only low voltages. On the other hand, the p-channel TFT is not required to operate at a very high speed but its OFF current must be low. In some cases, it is necessary that the p-channel TFT withstand high voltages. Accordingly, the requirement is that the anodized film of the n-channel TFT be thin (20 to 100 nm) and that the anodized film of the p-channel TFT be thick (250 to 400 nm). Steps for manufacturing the present example are described below.

A substrate 601 was fabricated from Corning 7059 glass, in the same way as in Example 5. An n-type doped region 602, a p-type doped region 603, a gate-insulating film 604, a gate electrode 606, and its interconnects 607 were formed. The gate electrode 606 and its interconnects 607 were connected with an interconnect 650 (FIGS. 22(A) and 19(A)).

An electrical current was passed through the gate electrode 606 and its interconnects 607. Films 613 and 614 of aluminum oxide were formed on the top and side surfaces of the gate electrode 606 and its interconnects 607 by anodization. The anodization was carried out similarly to Example 5 except that the maximum voltage was 50 V. The thickness of the anodized film fabricated in this step was about 60 nm (FIG. 19(B)).

Referring to FIG. 22(B), gate electrodes and their interconnects 606 were cut away from the interconnect 650 at 651 by laser etching. Under this condition, anodization was again initiated. The conditions were similar to the previous conditions except that the maximum voltage was increased to 250 V. Since no current flowed through the interconnect 606, no change was observed. However, an aluminum oxide film 615 having a thickness of about 300 nm was formed around the gate interconnects 607, because an electrical current flowed through the interconnects 607 (FIG. 19(C)).

Then, the laminate was laser annealed under the same conditions as in Example 5. In this case, in the n-channel TFT (on the left side of FIG. 19, (A)-(D)), the width $a_1$ of the amorphous region and of the offset regions was so narrow that it could be neglected. Where the surface of the aluminum interconnects was not coated with an anodized film, the interconnects were severely damaged by laser illumination. Therefore, it was necessary to form an anodized film though it was thin. On the other hand, in the p-channel TFT (on the right side of FIG. 19), the thickness of the anodized film was 300 nm. Also, amorphous regions 150 to 200 nm thick existed. The width $a_2$ of the offset regions was estimated to be 100 to 150 nm (FIG. 19(D)).

In the same way as in Example 5, the aluminum interconnects were etched at requisite locations by laser irradiation within the atmosphere. The gate electrode of the p-channel TFT was separated from the interconnect 607. Also, the interconnect 650 was cut off. An interlayer insulating film was formed. Contact holes were formed. Interconnects 624 and 611 were formed. In this way, a circuit was formed.

In the circuit fabricated in this way, the offset regions and the amorphous region of the n-channel TFT were narrow. The speed of operation was excellent though the OFF current was slightly large. On the other hand, it was difficult to operate the p-channel TFT at a high speed. However, the OFF current was small. The ability to hold the electric charge stored in the pixel capacitor was excellent.

There exist other situations in which TFTs having different functions must be packed on one substrate. For example, in a liquid-crystal display driver, high-speed TFTs are required for the logic circuits including shift registers, whereas TFTs withstanding high voltages are required for the output circuit. The method of this example is effective in fabricating TFTs which must satisfy such conflicting requirements.

EXAMPLE 7

Figure 20:
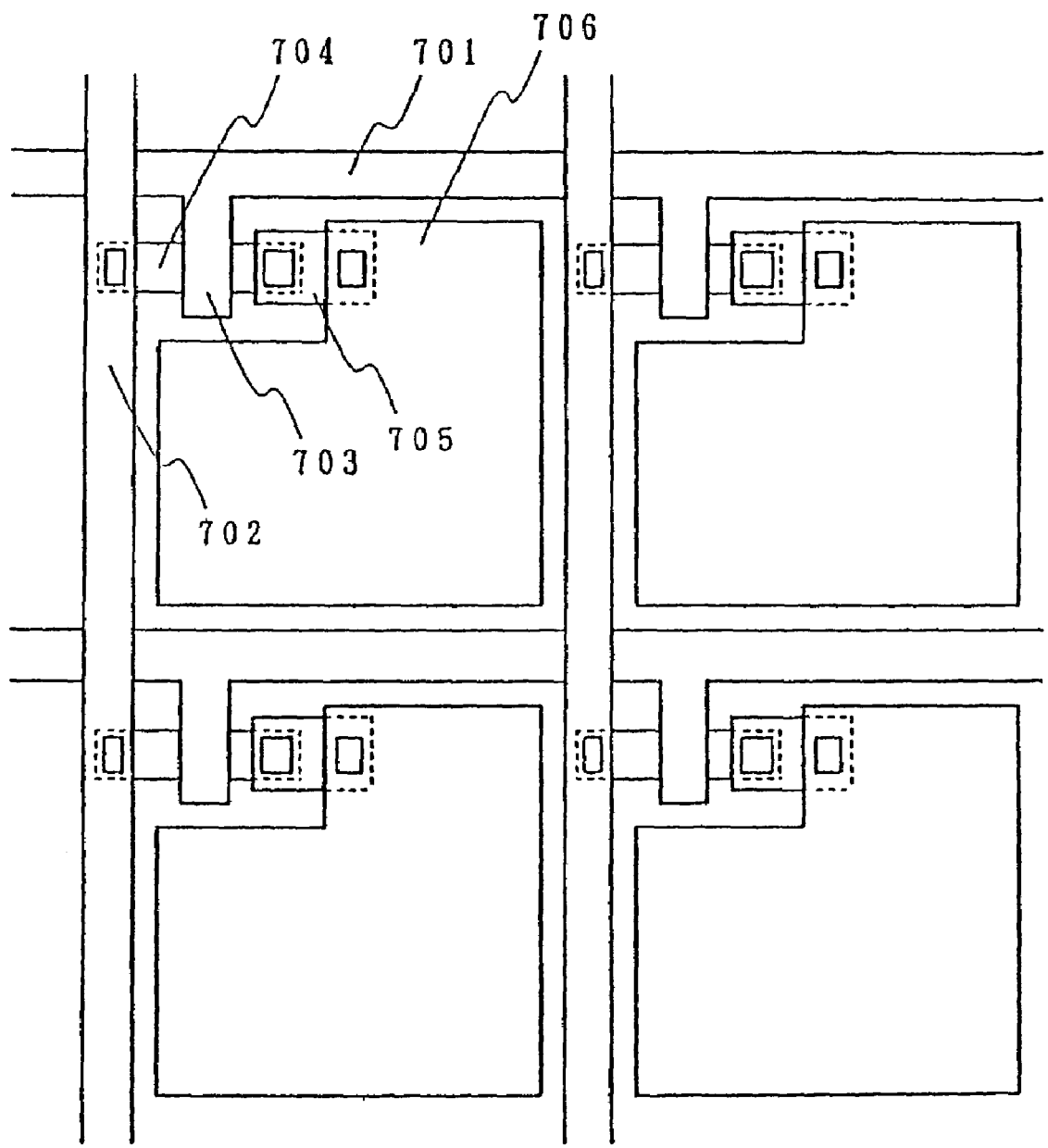
FIG. 20 is a plan view of an active-matrix liquid-crystal electro-optical device according to Example 6 of the invention.

An active-matrix circuit consisting of n-channel TFTs as shown in FIG. 20 was fabricated by the method used in Example 1. This active matrix comprised gate lines 701 and data lines 702 which were arranged in rows and columns. These lines were made of low-resistivity aluminum and coated with an aluminum oxide film having a thickness of 200 to 400 nm because the circuit underwent an anodization step according to the invention. The width of these lines was 2 μm. The thickness of these lines was 0.5 μm. Gate electrodes 703 of the TFTs for pixels were connected with the gate lines 701. The gate electrodes were also coated with aluminum oxide. A semiconductor layer 704 was formed under the gate electrodes. In the same way as the n-channel TFTs of Example 1, there existed n-type polycrystalline regions doped with phosphorus. With respect to offset regions which constitute one feature of the invention, their width was set to about 200 to 400 nm. The sources of this semiconductor layer were in contact with the data lines 702. The drains were connected via aluminum electrodes 705 with pixel electrodes 706 made of ITO.

FIG. 21 is a circuit diagram of an active-matrix device fabricated in the present example. FIG. 21(A) illustrates the operation of this device. FIG. 21(B) illustrates the operation of a device comprising TFTs fabricated by the prior art method, for the sake of comparison. As described previously, in the matrix circuit of this structure, it is known that when the charging of a capacitor $C_{LC}$ ends and the gate voltage ceases, the capacitor $C_{LC}$ is capacitively coupled to the gate line via the parasitic capacitance $C_{GD}$ of both gate and drain. The voltage drops by V from the charging voltage. This phenomenon is also observed in a circuit in which n-channel and p-channel TFTs are connected in parallel. This is described in detail in Japanese Patent application Ser. No. 208648/1991 filed by the present applicant.

As shown in FIG. 21, in a circuit consisting of only one TFT, i.e., either an n-channel TFT or a p-channel TFT, the voltage drop is given by $$V = C_{GD} \cdot V_G / (C_{LC} + C_{GD})$$

where $V_G$ is the difference between the ON voltage and OFF voltage of the gate voltage. For example, in a TFT fabricated without using a self-aligning process, the parasitic capacitance $C_{GD}$ is quite large and so the voltage drop V is also large. To solve this problem, a storage capacitor $C_{AD}$ was connected in parallel with the pixel capacitor as shown in FIG. 21 to increase the apparent capacitance of the pixel capacitor. However, this method does not fundamentally solve the problem. As described already, new problems such as a decrease in the aperture ratio are induced.

Even for devices fabricated by a self-aligning process, if the size of the pixels is so small that the effect of the parasitic capacitance of the TFTs compared with the pixel capacitance cannot be neglected, then this voltage drop poses a serious problem. For example, in a panel 3 inches in diagonal which is used for projection and matches high-definition television, the pixel capacitance is as small as 13 fF. On the other hand, where TFTs are fabricated by a process using 2 μm rule the aspect ratio of the interconnects is large. As a result, even if no overlapping exists, parasitic capacitance is produced in three dimensions geometrically. The capacitance reaches several fF, which is 10% or more of the pixel capacitance.

An active-matrix circuit using conventional TFTs is shown in FIG. 21(A). Obviously, the correct display to be provided is impeded by the voltage drop V. Specifically, in order to operate TFTs at a high speed, the gate voltage must be higher than the drain voltage. Usually, a voltage about twice as high as the drain voltage is used as the gate voltage. Therefore, if the drain voltage is 5 V, the gate voltage is 10 V or more. Where the gate voltage is made negative in OFF state to perfect the operation of the TFTs, the gate voltage varies to a larger extent. In the case of FIG. 21, the drain voltage is alternating current of ±6 V. The gate voltage is +12 V in ON state and −4 V in OFF state. From the equation above, we have the relation $V_G$ =16 V. If the parasitic capacitance is 2 fF, the voltage drop V is 2 V, as shown in FIG. 21(A). This reaches indeed one third of the drain-charging voltage. Of course, the electric charge stored in the pixel is discharged by spontaneous discharge and, therefore, it is more difficult in practice to provide an ideal display. To avoid this problem, storage capacitors must be provided at the expense of the aperture ratio.

On the other hand, in accordance with the present invention, the parasitic capacitance can be reduced greatly. More specifically, the capacitance can be reduced below 0.1 fF. Therefore, the voltage drop V can be almost neglected, as shown in FIG. 21(B). Furthermore, in accordance with the present invention, the OFF current is smaller than the OFF current of TFTs fabricated by the prior art method by about one order of magnitude. Consequently, the spontaneous discharge is much milder. Hence, an almost ideal display can be provided.

In this way, in accordance with the present invention, an insulating, anodized layer is formed at the surface of a gate electrode. As a result, the channel length is larger than the length of the gate electrode taken in the longitudinal direction of the channel. Hence, offset regions which receive no or very weak electric field from the gate electrode are formed on opposite sides of the channel region. Similarly, a doped amorphous semiconductor region having the same advantages can be formed. This reduces the leakage current in reverse bias. In consequence, capacitance which would have been heretofore needed to hold electric charge is dispensed with. The aperture ratio which has been approximately 20% in the prior art technique can be improved above 35%. Thus, display can be provided at higher quality.

In accordance with the present invention, the offset regions and the doped amorphous semiconductor region are determined by the thickness of the anodized film of the gate electrode. Therefore, the width of these regions can be controlled accurately to between 10 to 100 nm. We did not observe a great reduction in the production yield when this manufacturing step was added. Also, any factor which might be regarded as a cause of a decrease in the production yield did not existed.

While silicon semiconductor devices have been chiefly described thus far, it is obvious that the invention can be applied to semiconductor devices using germanium, silicon carbide, gallium arsenide, or other material.

What is claimed is:

1. A display device comprising:
    a blocking film formed over a substrate;
    a thin film transistor formed over said blocking film, said thin film transistor comprising a semiconductor layer having source and drain regions, a channel region between the source and drain regions and at least one lightly doped region between said channel region and at least one of said source and drain regions, and a gate electrode adjacent to the channel region with a gate insulating film interposed therebetween;
    an interlayer insulating film formed over the thin film transistor;
    an organic resin film formed over the interlayer insulating film; and
    a pixel electrode formed over the organic resin film and electrically connected to said thin film transistor.

2. The display device according to claim 1 wherein said substrate is a glass substrate.

3. The display device according to claim 1 wherein said blocking film comprises silicon oxide.

4. The display device according to claim 1 wherein a surface of the gate electrode is covered with an anodic oxide film.

5. The display device according to claim 1 wherein said organic resin film comprises polyimide.

6. The display device according to claim 1 wherein said display device is a liquid crystal device.

7. A display device comprising:
    a blocking film formed over a substrate;
    a thin film transistor formed over said blocking film, said thin film transistor comprising a semiconductor layer having source and drain regions, a channel region between the source and drain regions and at least one lightly doped region between said channel region and at least one of said source and drain regions, and a gate electrode adjacent to the channel region with a gate insulating film interposed the therebetween;
    an interlayer insulating film formed over the thin film transistor;
    a planarizing organic resin film formed over the interlayer insulating film; and
    a pixel electrode formed over the organic resin film and electrically connected to said thin film transistor.

8. The display device according to claim 7 wherein said substrate is a glass substrate.

9. The display device according to claim 7 wherein said blocking film comprises silicon oxide.

10. The display device according to claim 7 wherein a surface of the gate electrode is covered with an anodic oxide film.

11. The display device according to claim 7 wherein said organic resin film comprises polyimide.

12. The display device according to claim 7 wherein said display device is a liquid crystal device.

13. A display device comprising:
    a blocking film formed over a substrate;
    a thin film transistor formed over said blocking film, said thin film transistor comprising a semiconductor layer having source and drain regions, a channel region between the source and drain regions and at least one lightly doped region between said channel region and at least one of said source and drain regions, and a gate electrode adjacent to the channel region with a gate insulating film interposed therebetween;
    an organic resin film formed over the thin film transistor; and
    a pixel electrode formed over the organic resin film and electrically connected to said thin film transistor.

14. The display device according to claim 13 wherein said substrate is a glass substrate.

15. The display device according to claim 13 wherein said blocking film comprises silicon oxide.

16. The display device according to claim 13 wherein a surface of the gate electrode is covered with an anodic oxide film.

17. The display device according to claim 13 wherein said organic resin film comprises polyimide.

18. The display device according to claim 13 wherein said display device is a liquid crystal device.

19. An electric device having at least one display device, said display device comprising:
    a blocking film formed over a substrate;
    a thin film transistor formed over said blocking film, said thin film transistor comprising a semiconductor layer having source and drain regions, a channel region between the source and drain regions and at least one lightly doped region between said channel region and at least one of said source and drain regions, and a gate electrode adjacent to the channel region with a gate insulating film interposed therebetween;
    an interlayer insulating film formed over the thin film transistor;
    an organic resin film formed over the interlayer insulating film; and
    a pixel electrode formed over the organic resin film and electrically connected to said thin film transistor.

20. The electric device according to claim 19 wherein said electric device is a video camera.

21. An electric device having at least one display device, said display device comprising:
    a blocking film formed over a substrate;
    a thin film transistor formed over said blocking film, said thin film transistor comprising a semiconductor layer having source and drain regions, a channel region between the source and drain regions and at least one lightly doped region between said channel region and at least one of said source and drain regions, and a gate electrode adjacent to the channel region with a gate insulating film interposed therebetween;
    an interlayer insulating film formed over the thin film transistor;
    a planarizing organic resin film formed over the interlayer insulating film; and a pixel electrode formed over the organic resin film and electrically connected to said thin film transistor.

22. The electric device according to claim 21 wherein said electric device is a video camera.

23. An electric device having at least one display device, said display device comprising:
- a blocking film formed over a substrate;
- a thin film transistor formed over said blocking film, said thin film transistor comprising a semiconductor layer having source and drain regions, a channel region between the source and drain regions and at least one lightly doped region between said channel region and at least one of said source and drain regions, and a gate electrode adjacent to the channel region with a gate insulating film interposed therebetween;
- an organic resin film formed over said thin film transistor; and
- a pixel electrode formed over the organic resin film and electrically connected to said thin film transistor.

24. The electric device according to claim 23 wherein said electric device is a video camera.

25. The display device according to claim 1 wherein said lightly doped region has a lower crystallinity than said source and drain regions.

26. The display device according to claim 7 wherein said lightly doped region has a lower crystallinity than said source and drain regions.

27. The display device according to claim 13 wherein said lightly doped region has a lower crystallinity than said source and drain regions.

28. The display device according to claim 20 wherein said lightly doped region has a lower crystallinity than said source and drain regions.

29. The display device according to claim 22 wherein said lightly doped region has a lower crystallinity than said source and drain regions.

30. The display device according to claim 24 wherein said lightly doped region has a lower crystallinity than said source and drain regions.

* * * * *